United States Patent
Van Den Nieuwelaar et al.

(10) Patent No.: US 7,184,849 B2
(45) Date of Patent: Feb. 27, 2007

(54) METHOD OF PLANNING TASKS IN A MACHINE, METHOD OF CONTROLLING A MACHINE, SUPERVISORY MACHINE CONTROL SYSTEM, LITHOGRAPHIC APPARATUS, LITHOGRAPHIC PROCESSING CELL AND COMPUTER PROGRAM

(75) Inventors: Norbertus Josephus Martinus Van Den Nieuwelaar, Tilburg (NL); Johannes Onvlee, 's-Hertogenbosch (NL); Roel Boumen, Venlo (NL); Henricus Petrus Johannus Van Lierop, Weert (NL); Robert Jozef Dumont, Eindhoven (NL); Jacobus Eelkman Rooda, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 336 days.

(21) Appl. No.: 10/852,678

(22) Filed: May 25, 2004

(65) Prior Publication Data

US 2005/0278049 A1    Dec. 15, 2005

(51) Int. Cl.
*G06F 19/00*    (2006.01)

(52) U.S. Cl. ..................... 700/100; 700/103
(58) Field of Classification Search ............... 700/100, 700/103; 705/8
See application file for complete search history.

(56) References Cited

U.S. PATENT DOCUMENTS

| | | | |
|---|---|---|---|
| 4,980,824 A * | 12/1990 | Tulpule et al. | 718/106 |
| 6,487,469 B1 * | 11/2002 | Formenti | 700/100 |
| 2004/0093251 A1 * | 5/2004 | Heskin et al. | 705/8 |
| 2005/0137734 A1 * | 6/2005 | Nieuwelaar et al. | 700/100 |

* cited by examiner

*Primary Examiner*—Leo Picard
*Assistant Examiner*—Steven R. Garland
(74) *Attorney, Agent, or Firm*—Pillsbury Winthrop Shaw Pittman LLP

(57) ABSTRACT

A method of planning tasks to be performed in a machine derives a precedence graph by linking subsidiary tasks to a sequence of key tasks to create a scheduling problem that can be solved by an automated scheduler.

34 Claims, 16 Drawing Sheets

METHOD OF PLANNING TASKS IN A MACHINE, METHOD OF CONTROLLING A MACHINE, SUPERVISORY MACHINE CONTROL SYSTEM, LITHOGRAPHIC APPARATUS, LITHOGRAPHIC PROCESSING CELL AND COMPUTER PROGRAM

FIELD

The present invention relates to lithographic apparatus and lithographic processing cells, and planning and control methods and computer programs.

BACKGROUND

A lithographic apparatus is a machine that applies a desired pattern onto a target portion of a substrate. Lithographic apparatus can be used, for example, in the manufacture of integrated circuits (ICs). In that circumstance, a patterning device, such as a mask, may be used to generate a circuit pattern corresponding to an individual layer of the IC, and this pattern can be imaged onto a target portion (e.g. comprising part of, one or several dies) on a substrate (e.g. a silicon wafer) that has a layer of radiation-sensitive material (resist). In general, a single substrate will contain a network of adjacent target portions that are successively exposed. Known lithographic apparatus include so-called steppers, in which each target portion is irradiated by exposing an entire pattern onto the target portion at one time, and so-called scanners, in which each target portion is irradiated by scanning the pattern through the projection beam in a given direction (the "scanning"-direction) while synchronously scanning the substrate parallel or anti-parallel to this direction.

In a factory, commonly referred to as a "fab" or "foundry", in which semiconductor or other devices are manufactured, each lithographic apparatus is commonly grouped with a "track" comprising substrate handling devices and pre- and post-processing devices to form a "lithocell". Each of the lithographic apparatus and the track typically have a supervisory control system which are themselves under the control of a further supervisory control system. Substrates, which may be blank or have already been processed to include one or more process or device layers, are delivered to the lithocell in lots (also referred to as batches) for processing. A lot is, in general, a group of substrates which are to processed by the lithocell in the same way and is accompanied by a "recipe" which specifies the processes to be carried out. The lot size may be arbitrary or determined by the size of carrier used to transport substrates around the fab. The recipe may include details of the resist coating to be applied, temperature and duration of pre- and post-exposure bakes, details of the pattern to be exposed and the exposure settings for that, development duration, etc. A large number of tasks must be performed to complete the recipe for a given batch and there are many possible ways these can be done, as in many cases both the track and lithographic apparatus are capable of performing multiple tasks at once, e.g. if the track includes multiple spin coaters or multipurpose stations or if the lithographic apparatus is a dual stage apparatus having measurement and exposure stations. Thus scheduling the tasks to be performed, and optimizing that schedule, e.g. to maximize throughput, is a complex task.

In most cases, on-the-fly scheduling is limited and most sequences of tasks are hard-coded in the control software of the apparatus or the supervisory control system. A more flexible approach to scheduling is to construct a tree based on tasks to be completed and their precedence relation. In such a tree, starting from an origin, branches represent possible tasks that may be carried out and lead to leaves, from which further branches represent tasks that may then be carried out, and so on. Scheduling then becomes a matter of selecting a path through the tree.

With existing scheduling methods, there remains a need for a method of automatically converting an order for work to a plan which can then be scheduled. Further there remains a need to adapt to changed circumstances, e.g. orders for additional work or exceptions in the carrying out of a schedule, preferably with minimum loss of throughput.

SUMMARY

Accordingly, it would be advantageous, for example, to provide an improved method of planning tasks in a machine such as a lithographic apparatus and lithographic processing cell, or part thereof.

According to an aspect of the invention, there is provided a method of planning tasks in a machine, the machine being at least a sub-system of a lithographic apparatus or lithographic processing cell, the method comprising:

receiving an order for work to be carried out by the machine;

determining key tasks to be carried out to fulfill the order;

generating a key task sequence comprising the key tasks;

determining any subsidiary tasks, including one or more logistic tasks, one or more pre-processing tasks and/or one or more post-processing tasks, to be carried out before or after each of the key tasks; and generating a scheduling problem instance comprising the subsidiary tasks linked to respective ones of the key tasks.

A plan, in the form of, for example, a precedence graph, can be built up from a sequence of key tasks used to fulfill an order by adding in a logical and predetermined manner the other pre-processing, or preparatory, and/or post-processing or finishing tasks. The preparatory tasks may include logistic tasks, that is tasks involved in moving materials used in the key tasks between resources of the machine, and/or pre-processing or setup tasks, that is tasks needed to prepare the materials and/or resources for the key tasks. Finishing tasks may also include logistic tasks as well as post processing tasks. The precedence graph constitutes a scheduling problem in a form that can be provided to an automated scheduler such as described in co-pending U.S. patent application Ser. No. 10/743,320, filed 23 Dec. 2003 and entitled "METHOD OF OPERATING A LITHOGRAPHIC APPARATUS OR LITHOGRAPHIC PROCESSING CELL, LITHOGRAPHIC APPARATUS AND LITHOGRAPHIC PROCESSING CELL", which document is hereby incorporated in its entirety.

In an embodiment of the invention, an order for work may comprise the printing of a given pattern, e.g. embodied in a mask or a data file, onto a given lot of substrates under certain conditions. In such a case, the key tasks may comprise the actual exposure tasks necessary to effect the ordered printing. The logistic and preprocessing tasks may then comprise tasks ranging from coating the a substrate with a radiation sensitive resist through to pre-alignment and measurement or characterization of a resist-coated substrate together with the relevant transportation tasks, dependent on the systems or sub-systems to be controlled according to the generated plan. In addition, the logistic and preprocessing tasks may comprise tasks relating to the provision of a mask or masks embodying the pattern to be printed—such as mask loading, cleaning and inspection tasks—or tasks involved with the delivery of a data file embodying the mask to a programmable patterning device—such as retrieval from a data storage device, decompressing, error checking and/or rasterization. Similarly, post-processing tasks may comprise transportation tasks for substrates, and masks if used, as well as tasks such as inspection, post exposure bake, developing, etc., again dependent on the systems or sub-systems to be controlled according to the generated plan. Where a programmable patterning device is used, post-processing tasks may include resetting of that device.

In an embodiment of the invention, the method further comprises adding a precedence edge between at least two of the subsidiary tasks linked to different ones of the key tasks. Precedence edges may, for example, express the order of delivery of materials, such as substrates, to the machine or the re-use of materials, such as masks.

According to another aspect of the invention, there is provided a method of controlling a machine, the machine being at least a subsystem of a lithographic apparatus or lithographic processing cell, the method comprising:

controlling the machine to perform tasks according to a first schedule derived from a first plan;

receiving a trigger during the performance of the tasks, the trigger indicating the occurrence of an event relevant to planning;

continuing to control the machine to perform tasks according to the first schedule for a predetermined period;

during the predetermined period, generating a second plan taking into account the event and deriving a second schedule from the second plan; and after the predetermined period, controlling the machine to perform tasks according to the second schedule.

Various events that may occur during the course of performing work may require or make desirable a change to a scheduled plan. For example, a new order for work may be received or there may be an exception in work underway. Examples of exceptions include failure of a task or a delay in completion of a task. With the above method, an automated control system may respond to a trigger to generate a new plan and schedule without reduction of throughput by continuing to perform work for a predetermined period of time. The continuation of work allows for time to perform the revision of plan and schedule. It may also allow time to complete tasks already in progress and/or dispatched to the machine as well as tasks that are tied to the tasks in progress. The duration of the predetermined time may therefore depend on the characteristics of the machine and the plan in progress as well as the extent of revision of the plan and schedule that is to be performed. In the case of an exception, especially a task failure, the predetermined time may allow for the results of other, related processes to be received, ensuring that an effective plan to recover from the errors can be generated. With this method, the throughput of the machine may be maximized because it continues to do useful work while the replanning and/or rescheduling is performed.

Where the trigger is an order for new work, replanning and/or rescheduling can be performed in several different ways. In the simplest case, new work is simply added onto the end of the existing plan. This involves the least planning and scheduling computation but may overlook opportunities to increase throughput. With increasing computational effort, it is possible to reschedule, re-plan or reorder some or all of the existing plan and schedule. The more of the existing schedule that is allowed to be altered the greater the potential for time-savings, e.g. by performing parts of different orders in parallel or by re-use of materials in subsequent orders. The relative timing and priority of orders may also be altered.

In the case of a trigger representing an exception, again there are different ways in which the remedial tasks can be integrated into the schedule. For example, the remainder of the existing schedule can be retimed until after completion of the recovery tasks or the recovery tasks can be integrated, as key tasks, into a new plan and schedule.

According to further aspects of the invention, there are provided a lithographic processing cell, a lithographic apparatus and a track unit, each including a control system as described above.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of 365, 248, 193, 157 or 126 nm) and extreme ultra-violet (EUV) radiation (e.g. having a wavelength in the range of 5–20 nm), as well as particle beams, such as ion beams or electron beams.

The term "patterning device" used herein should be broadly interpreted as referring to any device that can be used to impart a projection beam with a pattern in its cross-section such as to create a pattern in a target portion of the substrate. It should be noted that the pattern imparted to the projection beam may not exactly correspond to the desired pattern in the target portion of the substrate. Generally, the pattern imparted to the projection beam will correspond to a particular functional layer in a device being created in the target portion, such as an integrated circuit.

A patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions; in this manner, the reflected beam is patterned. In each example of a patterning device, the support structure may be a frame or table, for example, which may be fixed or movable as required and which may ensure that the patterning device is at a desired position, for example with respect to the projection system. Any use of the terms "reticle" or "mask" herein may be considered synonymous with the more general term "patterning device".

The term "projection system" used herein should be broadly interpreted as encompassing various types of projection system, including refractive optical systems, reflective optical systems, and catadioptric optical systems, as appropriate for example for the exposure radiation being used, or for other factors such as the use of an immersion liquid or the use of a vacuum. Any use of the term "projection lens" herein may be considered as synonymous with the more general term "projection system".

The illumination system may also encompass various types of optical components, including refractive, reflective, and catadioptric optical components for directing, shaping, or controlling the projection beam of radiation, and such components may also be referred to below, collectively or singularly, as a "lens".

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein a surface of the substrate is immersed in a liquid having a relatively high refractive index, e.g. water, so as to fill a space between the final element of the projection system and the substrate. Immersion liquids may also be applied to other spaces in the lithographic apparatus, for example, between the mask and the first element of the projection system. Immersion techniques are well known in the art for increasing the numerical aperture of projection systems.

The methods described herein may be implemented as software, hardware or a combination. In an embodiment, there is provided a computer program comprising program code that, when executed on a computer system, instructs the computer system to perform any or all of the methods described herein.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
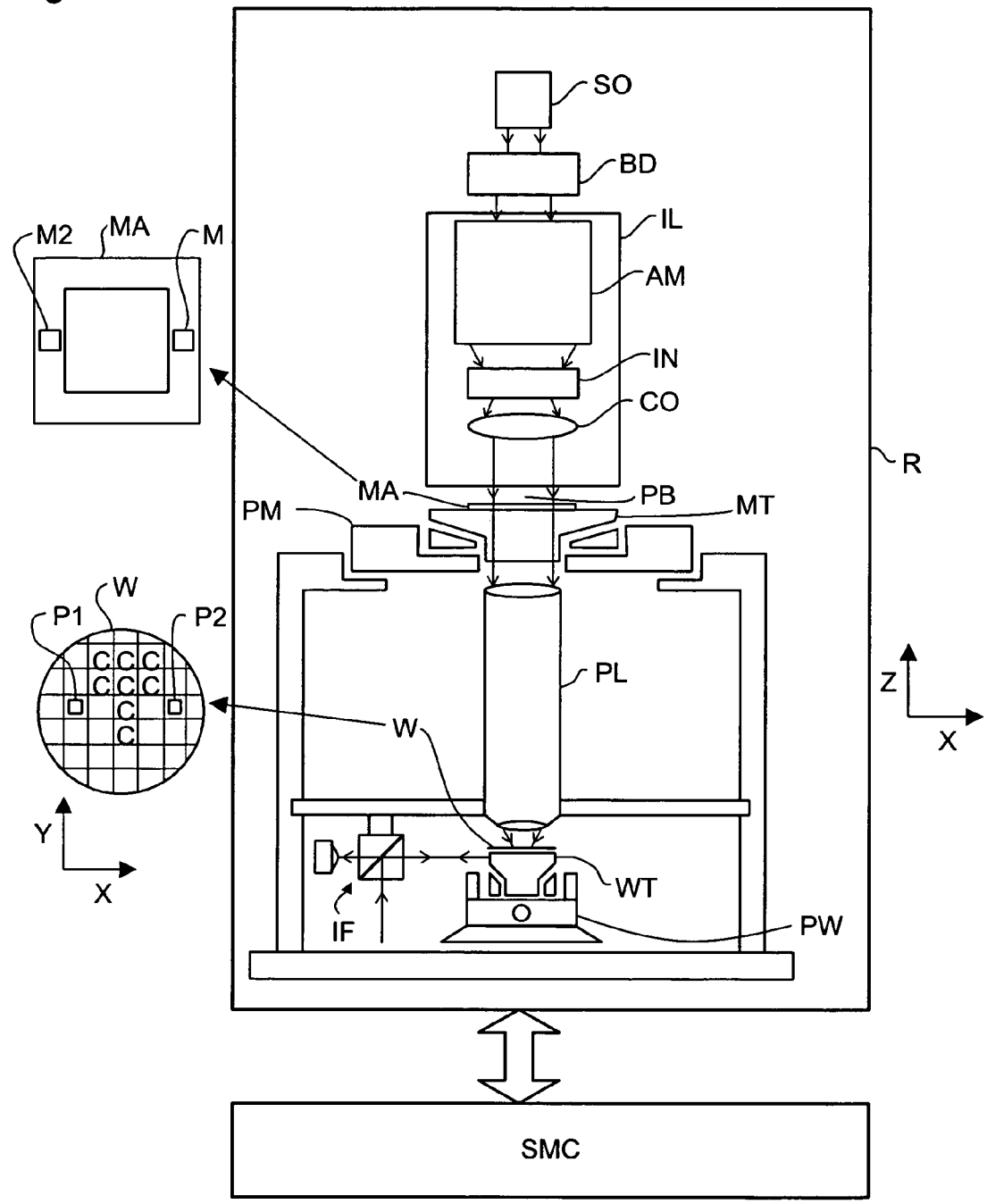
FIG. 1 depicts a lithographic apparatus according to an embodiment of the invention.

FIG. 1 schematically depicts a lithographic apparatus according to a particular embodiment of the invention. The apparatus comprises:
  an illumination system (illuminator) IL for conditioning a projection beam PB of radiation (e.g. UV radiation or DUV radiation).
  a first support structure (e.g. a mask table) MT (also referenced S0 below) for holding a patterning device (e.g. a mask) MA and connected to a first positioning device PM for accurately positioning the patterning device with respect to item PL;
  two substrate tables (e.g. wafer tables) WT (also referenced C1,C2 below) for holding a substrate (e.g. a resist-coated wafer) W and connected to a second positioning device PW for accurately positioning the substrate with respect to item PL; and
  a projection system (e.g. a refractive projection lens) PL for imaging a pattern imparted to the projection beam PB by patterning device MA onto a target portion C (e.g. comprising one or more dies) of the substrate W.

As here depicted, the apparatus is of a transmissive type (e.g. employing a transmissive mask). Alternatively, the apparatus may be of a reflective type (e.g. employing a programmable mirror array of a type as referred to above).

The illuminator IL receives a beam of radiation from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising for example suitable directing mirrors and/or a beam expander. In other cases the source may be integral part of the apparatus, for example when the source is a mercury lamp. The source SO and the illuminator IL, together with the beam delivery system BD if required, may be referred to as a radiation system.

The illuminator IL may comprise an adjusting device AM for adjusting the angular intensity distribution of the beam. Generally, at least the outer and/or inner radial extent (commonly referred to as σ-outer and σ-inner, respectively) of the intensity distribution in a pupil plane of the illuminator can be adjusted. In addition, the illuminator IL generally comprises various other components, such as an integrator IN and a condenser CO. The illuminator provides a conditioned beam of radiation, referred to as the projection beam PB, having a desired uniformity and intensity distribution in its cross-section.

The projection beam PB is incident on the mask MA, which is held on the mask table MT. Having traversed the mask MA, the projection beam PB passes through the projection system PL, which focuses the beam onto a target portion C of the substrate W. With the aid of the second positioning device PW and position sensor IF (e.g. an interferometric device), the substrate table WT can be moved accurately, e.g. so as to position different target portions C in the path of the beam PB. Similarly, the first positioning device PM and another position sensor (which is not explicitly depicted in FIG. 1) can be used to accurately position the mask MA with respect to the path of the beam PB, e.g. after mechanical retrieval from a mask library, or during a scan. In general, movement of the object tables MT and WT will be realized with the aid of a long-stroke module (coarse positioning) and a short-stroke module (fine positioning), which form part of one or both of the positioning devices PM and PW. However, in the case of a stepper (as opposed to a scanner) the mask table MT may be connected to a short stroke actuator only, or may be fixed. Mask MA and substrate W may be aligned using mask alignment marks M1, M2 and substrate alignment marks P1, P2.

The depicted apparatus can be used in the following preferred modes:

1. In step mode, the mask table MT and the substrate table WT are kept essentially stationary, while an entire pattern imparted to the projection beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.
2. In scan mode, the mask table MT and the substrate table WT are scanned synchronously while a pattern imparted to the projection beam is projected onto a target portion C (i.e. a single dynamic exposure). The velocity and direction of the substrate table WT relative to the mask table MT is determined by the (de-)magnification and image reversal characteristics of the projection system PL. In scan mode, the maximum size of the exposure field limits the width (in the non-scanning direction) of the target portion in a single dynamic exposure, whereas the length of the scanning motion determines the height (in the scanning direction) of the target portion.
3. In another mode, the mask table MT is kept essentially stationary holding a programmable patterning device, and the substrate table WT is moved or scanned while a pattern imparted to the projection beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes a programmable patterning device, such as a programmable mirror array of a type as referred to above.

Combinations and/or variations on the above described modes of use or entirely different modes of use may also be employed.

The parts of the apparatus described above may be regarded as resources, collectively referred to as R, and may be controlled by a supervisory machine control system SMC.

From the supervisory machine control point of view, the machine can be considered as a task resource system (TRS)—manufacturing processes are considered as tasks, whereas mechatronic systems are considered as resources. Optimization of machine behavior can start from several TRS definition levels, as has been described in N. J. M. van den Nieuwelaar, J. M. van de Mortel-Fronczak, J. E. Rooda, "Design of Supervisory Machine Control", European Control Conference 2003, which document is hereby incorporated in its entirety by reference. The higher the definition level, the more room there is for choices. By making choices, TRS definitions can be transformed to lower levels, to finally result in temporal machine behavior (TRS definition level 0: timed TRS, see FIG. 2). In the paper "Design of Supervisory Machine Control", the lower two TRS definition levels (1,0) and the applicable transformation functionality between them (layer A) are formally described, and the higher definition levels and the issues involved are introduced. Furthermore, some considerations to be taken into account when deciding to either make choices design-time or run-time (by SMC) are given. Finally, an overview of known techniques to support the design of SMC is discussed.

In co-pending U.S. patent application Ser. No. 10/743,320 filed 23 Dec. 2003 and entitled "METHOD OF OPERATING A LITHOGRAPHIC APPARATUS OR LITHOGRAPHIC PROCESSING CELL, LITHOGRAPHIC APPARATUS AND LITHOGRAPHIC PROCESSING CELL", which document is hereby incorporated in its entirety, the definition level of the starting point of the optimization problem is raised from 1 to 2: an unselected TRS and a solution for the optimization problem is presented that starts from a system definition of class 2, taking into account the technique considerations described in "Design of Supervisory Machine Control". Also, important requirements for the approach are extendibility towards definition level 3, and run-time usability in SMC. An embodiment of the present invention is an extension to that approach for model-based supervisory control of manufacturing machines, with the aim of handling exceptions in the manufacturing process and real time receipt of work orders.

Figure 3:
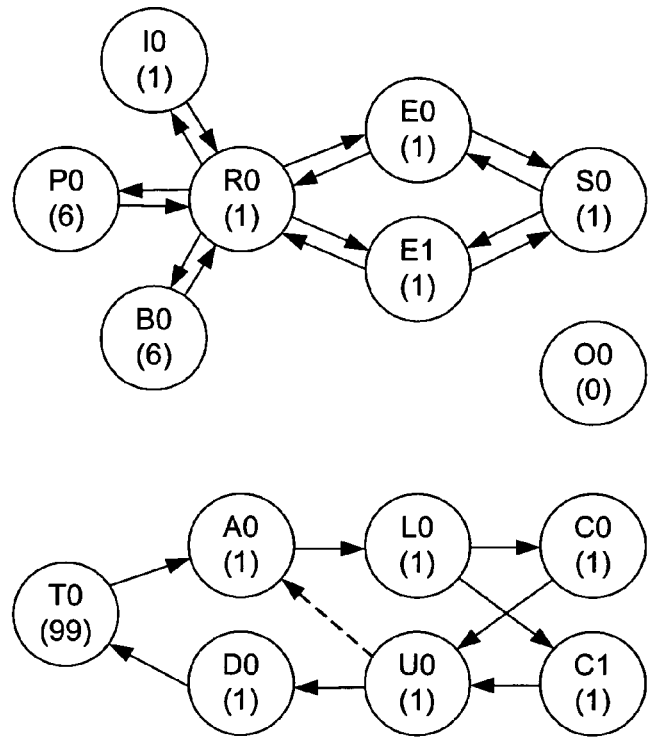
FIG. 3 depicts resources of a lithographic apparatus according to an embodiment of the invention.

FIG. 3 shows a schematic layout of a dual-stage scanning lithographic apparatus, the control of which is performed by an exemplary embodiment of the invention. In this Figure, circles depict the mechatronic subsystems or resources, and arrows depict the possible transport paths. The number of material instances that a resource can carry is depicted between brackets. Furthermore, the lower part of the Figure concerns substrates, whereas the upper part concerns masks. The resources comprise:

- A mask table S0 (MT in FIG. 1) for holding a mask embodying the pattern to be projected.
- Two substrate tables C0, C1 (WT in FIG. 1) each for holding a substrate and displaceable between measurement and exposure stations.
- A radiation source, illumination system and projection system O0 (separately referenced SO, IL, PL in FIG. 1).
- A pre-alignment unit A0 for aligning substrates in a predetermined orientation before they are transferred to one of the substrate tables.
- A track T0, which in many cases is a separate apparatus, coats unexposed substrates with radiation sensitive resist and develops the exposed substrates and delivers substrates to the alignment system.
- A load robot L0 transports substrates from the pre-alignment unit A0 to the substrate tables.
- An unload robot U0 transports substrates from the substrate tables to the discharge unit D0, from which they are picked up by the track.
- A mask pod P0 by which masks enter and leave the apparatus.
- An inspection station I0 for inspecting all mask before they can be used for exposure.
- A buffer station B0 that can be used to store inspected masks.
- Two elevators E0 and E1 for transporting masks to and from the mask table.
- A mask robot R0 for transporting masks between the pod, the elevators, the inspection station and buffer.

For the present purposes, the timing transformation can be disregarded so that for this apparatus, the scheduling model can be defined by an 18-tuple:

$$(T_2, L_2, G_2, N_2, Ln_2, Gn_2, Ga_2, R, C, I_2, A, P_2, Pt_2, M_2, Cb_2, Ce_2, Rm, Mf)$$

where $T_2$ is a finite set whose elements are called tasks.
$L_2$ is a finite set whose elements are called clusters.
$G_2$ is a finite set whose elements are called groups.
$N_2$ is a finite set whose elements are called nodes and is a generalization of the model elements: $N_2 = T_2 \cup L_2 \cup G_2$.
$Ln_2: L_2 \to P(N_2)$ gives the set of nodes that are in a certain cluster.
$Gn_2: G_2 \to P(N_2)$ gives the set of nodes (alternatives) that a group comprises.
$Ga_2: G_2 \to P(\mathbb{N}))$ gives the allowed numbers (including 0) of nodes to be selected from a group.
R is a finite set whose elements are called resources.
C is a finite set whose elements are called capabilities.
$I_2: T_2 \to P(C)$ gives the set of capabilities that are involved with a certain task.
$A: C \to P(R)$ gives the set of resources that are available for a certain capability.
$P_2 \in P(N_2 \times N_2)$ is the precedence relation between nodes.
$Cb_2, Ce_2: TC \to P(M)$ give the begin and the end material configuration of each capability involved in a certain task, where $TC = \{(t,c)|t \in T_2, C \in I_2(t)\}$.
$Rm: R \to \mathbb{N}$ gives the number of material instances that can reside on a given resource.
$Mf \subseteq R \to R$ represents the physically possible material flow as a set of tuples defining from resource to which resource material can flow.

Figure 2:
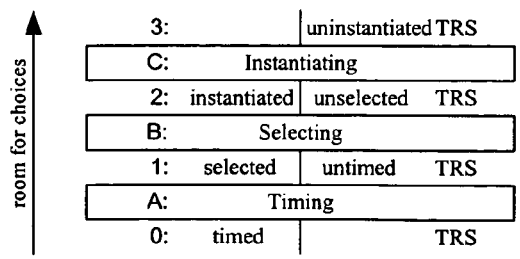
FIG. 2 depicts definition levels of Task Resource Systems (TRS) according to an embodiment of the invention.

Some of the elements have a suffix, which represents the definition level in FIG. 2. The elements that do not have a suffix are level independent.

The scheduling model in a complex machine can be split into two sections: system-dependent elements and work-dependent elements. The system-dependent elements can be provided in one or more configuration files that are specific to a particular machine or machine-type. Different configuration files may be related to different sub-systems of the apparatus allowing for separate development of different parts of the machine. A generic planning engine refers to the configuration files and can therefore be used for several different machines and easily updated in response to changes in the machine capability, e.g. due to upgrades, and can be used for many different machines. Work-dependent elements can be provided with each order. The system-dependent elements for the present example can be defined using FIG. 3 as follows:

There are thirteen capabilities. For substrates: the substrate tables, the load and unload robots, the pre-alignment and discharge units, and the track. For masks: the mask table, the elevator, the robot, the inspection and buffer station, and the pod. Besides that, there is a capability for the radiation and projection systems.

C={C,L,U,A,D,T,S,E,R,I,B,P,O}.

There are fifteen resources: one for each capability, except that there are two substrate tables and two elevators:

R={C0,C1,L0,U0,A0,D0,T0,S0,E0,E1, I0,B0,R0,P0, O0}.

The available resources for each capability are defined as follows:

A={(C, {C0,C1}), (L, {L0}), (U, {U0}), (A, {A0}), (D, {D0}), (T, {T0}), (S, {S0}), (E, {E0,E1}), (I, {I0}), (B, {B0}), (R, {R0}), (P, {P0})(O, {O0})}.

The material capacity of the resources is one for each resource, except for the track, the pod, and the buffer:

Rm={(C0,1), (C1,1), (L0,1), (U0,1), (A0,1), (D0,1), (T0,99), (S0,1), (E0,1), (E1,1), (I0,1), (B0,6), (R0,1), (P0,6), (O0,1)}.

The possible material flow is defined as follows:

Mf={(T0, A0), (A0, L0), (L0, C0), (L0, C1), ... }.

To define the work-dependent elements, the steps in the manufacturing process of substrate W1 and mask RA in the example are analyzed for one exposure. These 'basic' lives of a substrate and a mask are depicted in the precedence graph of FIG. 4. First, the substrate is transported from the track onto the pre-alignment unit (T2A). Subsequently, the pre-alignment takes place (Ali). After that, the load robot takes the substrate from the pre-alignment unit (A2L), and places the substrate onto a substrate table (sometimes referred to as a "chuck") (L2C). On the substrate table, the substrate is measured (mea) and, subsequently, exposed (exp). Then, the unload robot takes the substrate from the substrate table (C2U) and puts the substrate onto the discharge unit (U2D). Finally, the substrate is taken from the discharge unit by the track (D2T).

Figure 4:
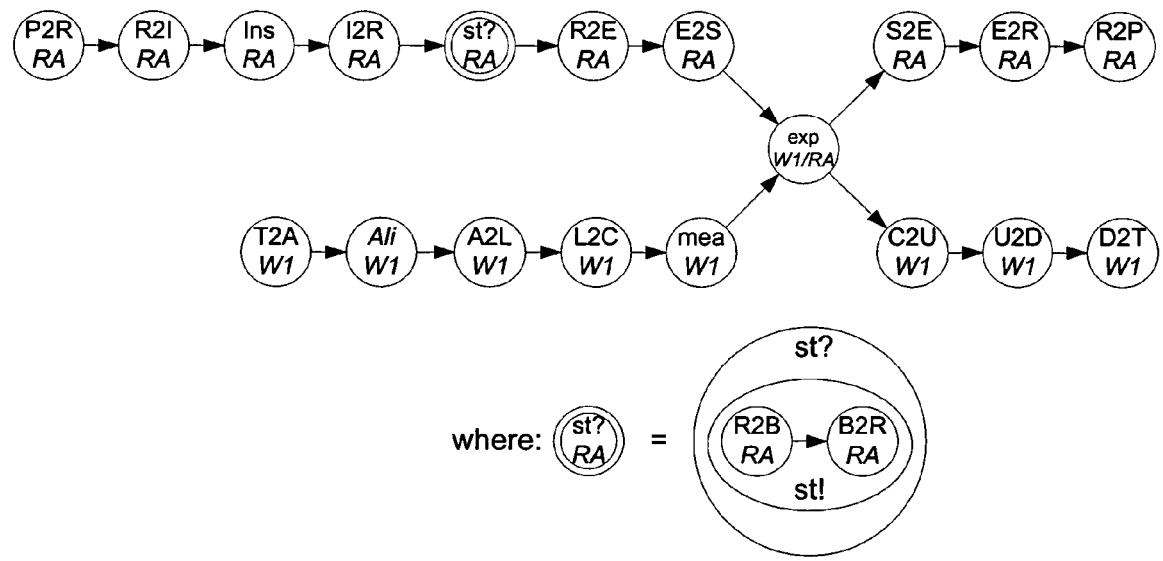
FIG. 4 depicts tasks in the lives of a mask and a substrate in an exemplary lithographic process.

The life of a mask comprises the following steps. The robot takes the mask from the pod (P2R), and puts the mask onto the inspection station (R2I), where it is inspected (Ins). After taking the mask from the inspection station (I2R), there is a possibility to store the mask (st?). Subsequently, the robot puts the mask onto an elevator (R2E), that puts the mask onto the mask stage (E2S). At the stage, the mask is used for exposure (exp). When exposure is done, an elevator picks the mask up (S2E), after which the robot takes the mask over (E2R) and puts it back into the pod (R2P). All nodes in FIG. 4 are tasks, except for the possible storage node (st?), that is depicted by a double circle. This node can be expanded, as shown at the bottom of FIG. 4. The node hierarchy is as follows. The upper node (st?) is a node of type group, of which zero or one alternatives must be chosen. The group node comprises one alternative of node type cluster (st!) comprising two consecutive tasks, to describe transportation of the mask to the buffer (R2B), followed by transportation back (B2R).

Note many of the above mentioned tasks may involve preparatory or setup tasks to be performed by the relevant resources—these are not discussed further herein but can be seen in some example schedules.

For the basic material lives of substrate W1 and mask RA as depicted in FIG. 4, the work-dependent elements can be instantiated as follows:

$T_2$={W1-T2A, W1-Ali, ..., RA-P2R,RA-R2I, ...}.
$L_2$={RA-st!}.
$G_2$={RA-st?}.
$I_2$={(W1-T2A, {T,A}), (W1-Ali, {A}), ...}.
$P_2$={(W1-T2A, W1-Ali), (W1-Ali, W1-A2L), ...}.
$Pt_2$={(RA-P2R, RA-R2I), (RA-I2R, RA-st?), (RA-st?, RA-R2E), (RA-E2R, RA-R2P)}.

These precedence relations concern all transportation tasks involving the mask robot.

$Ln2$={(RA-st!, {RA-R2B, RA-B2R})}.
$Gn2$={(RA-st?, {RA-st!})}
$Ga2$={(RA-st?, {0,1})}.
$M_2$={RA, W1}.
$Cb_2$={((W1-T2A, T), {W1}), (W1-T2A, A), { }), ((W1-Ali, A), {W1}) ...}.
$Ce_2$={((W1-T2A, T), { }), ((W1-T2A, A), {W1}), ...}.

For the basic material lives of substrate W1 and mask RA as depicted in FIG. 4, the work-dependent elements can be instantiated as follows:

$T_2$={W1-T2A, W1-Ali, ..., RA-P2R, RA-R21, ...}.
$L_2$={RA-st!}.
$G_2$={RA-st?}
$I_2$={(W1-t2A, {T, A}), (W1-Ali, {A}), ...}.
$P_2$={(W1-T2A, W1-Ali), (W1-Ali, W1-A2L), ...}.
$Pt_2$={RA-P2R, RA-R21), (RA-I2R, RA-st?), (RA-st?, RA-R2E), (RA-E2R, RA-R2P)}.

These precedence relations concern all transportation task involving the mask robot.

$Ln_2$={RA-st!, {RA-R2B, RA-B2R})}.
$Gn_2$={(RA-st?, {RA-st!})}.
$Ga_2$={RA-st?, {0,1})}.
$M_2$={RA, W1}.
$Cb_2$={((W1-T2A, T), {W1}), ((W1-T2A, A), { }), ((W1-Ali, A), {W1}), ...}.
$Ce_2$={((W1-T2A, T), { }), ((W1-T2A, A), {W1}), ...}.

Note that by convention, task names are in upper case and start with the associated material instance identifier, id.

Figure 5:
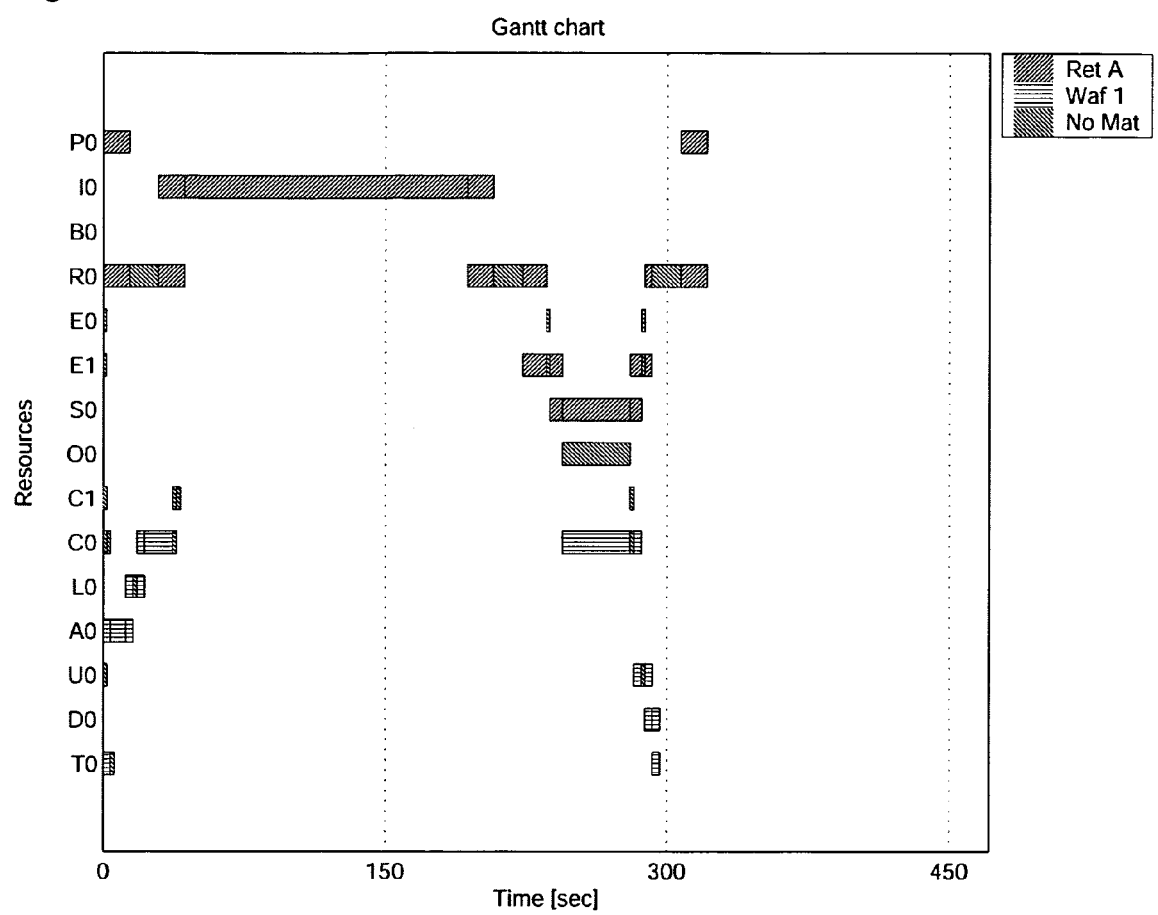
FIG. 5 is a Gantt chart corresponding to the task diagram of FIG. 4.

A schedule for this basic scheduling problem is shown in FIG. 5.

It is common in lithography to use multiple masks to expose a single IC, each containing parts of the pattern. A typical example is the use of two masks, one containing the coarse part of the circuit and one containing the fine details. In other cases, one mask may carry the horizontal features and a second the vertical features; different illumination settings are used for the two exposures. As an example of an embodiment of the method of the invention the planning of such a dual exposure order for a batch of two substrates (order 1) will now be discussed. The masks involved are RA and RB, and exposure should be done according to the 'ABBA' pattern. This means that the first substrate is exposed using mask RA first and then using mask RB, and for any following substrates, the mask order used for exposure alternates.

As a first step in the planning process we focus on the primary manufacturing process: exposure. For order 1, a sequence of four exposure steps can be determined: first expose substrate W1 with mask RA, then expose substrate W1 with mask RB, subsequently expose substrate W2 with mask RB, and finally expose mask W2 with mask RA. Next the secondary manufacturing processes can be added: the logistics and the pre-processing. Before a substrate can be exposed on a substrate table, a sequence of logistic input and pre-processing steps must be carried out on the substrate, as is explained in the previous section, and shown in the lower-left part of FIG. 4. This sequence of steps is called 'load substrate' below. After the exposure of a substrate, a sequence of logistic output steps must be carried out on the substrate, as is shown in the lower-right part of FIG. 4. This sequence is called 'unload substrate' below. At the right side of FIG. 6, the precedence graph concerning substrates for order 1 is depicted. The four exposure steps are depicted in a dashed box. Before the first exposure step of each substrate, a 'load substrate' sequence is shown, whereas an 'unload' substrate sequence is shown after the latest exposure step of each substrate. As the track first delivers substrate W1 and then substrate W2, a precedence edge is drawn between the first two 'T2A' nodes.

Figure 6:
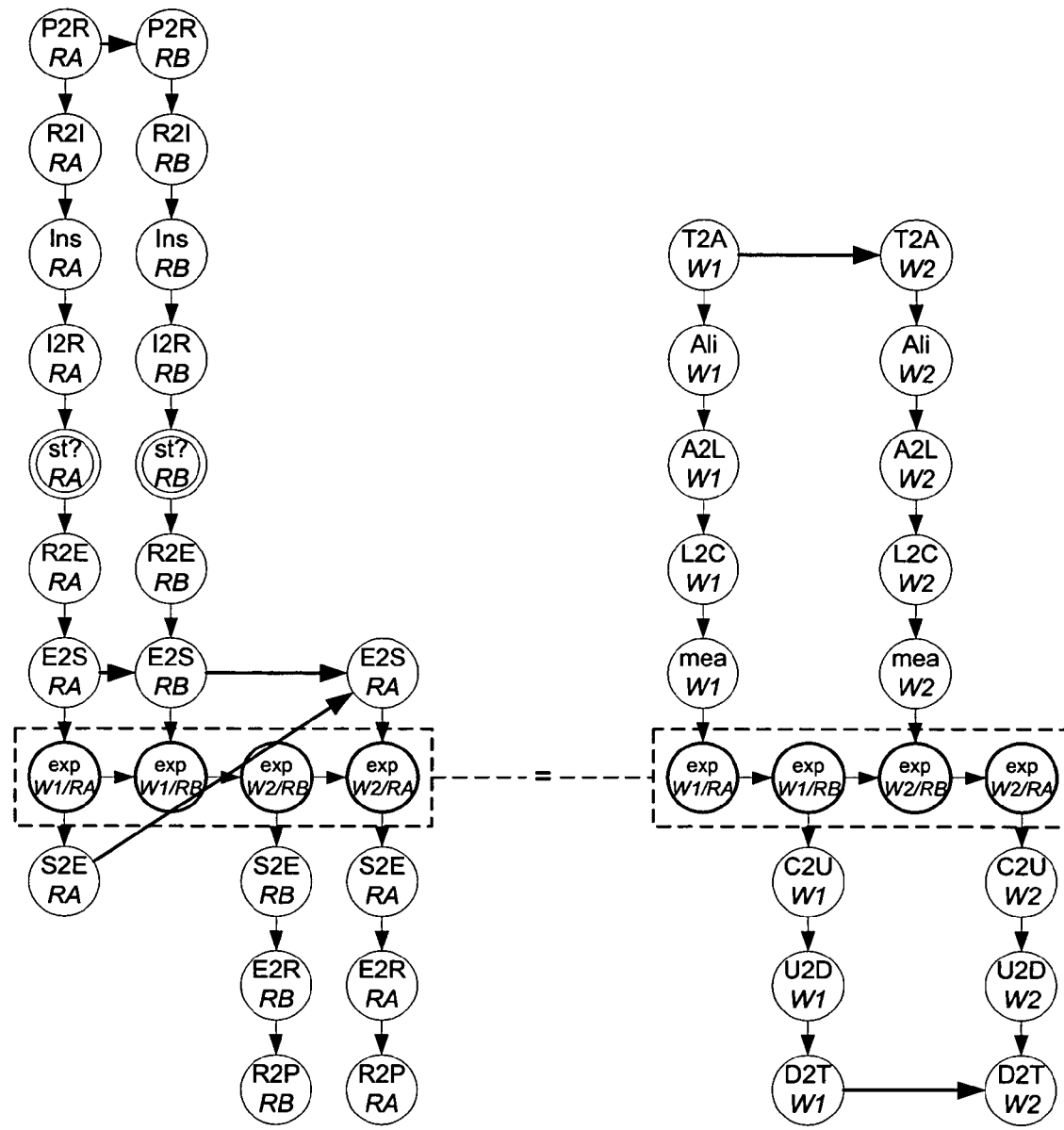
FIG. 6 is a precedence graph created in the performance of a method according to an embodiment of the invention.

At the left side of FIG. 6, the mask view on the precedence graph for order 1 is depicted. For clarity, the dashed box containing the four exposure nodes is copied. Mask RB, that is needed once at the mask stage, needs a similar load and unload like the substrates. However, mask RA is needed twice. In between the exposures using mask RA, it is not necessary to go all the way back to the pod: the mask can stay on an elevator. Therefore, the total load and unload sequences for masks are split in two. The 'load mask' and 'unload mask' sequences comprise only one step: 'E2S' and 'S2E', respectively. Like 'load substrate' and 'unload substrate' they are added for the first and the last exposure step in which the mask is needed, respectively. To transport masks from the pod to the elevators and back, the 'preload mask' and 'post unload mask' sequences are added for the first and the last time the mask is needed at an elevator, respectively. As in the substrate case, the first nodes of the mask preload and load sequences are connected by a precedence edge.

In this embodiment of the invention, the graph is constructed automatically, according to certain predetermined steps. For example at several points, a sub-graph ('load substrate', etc.) is inserted into the existing graph. These sub-graphs can be regarded as building blocks. The primary manufacturing process, the exposure sequence, forms an important reference to decide whether a sub-graph should be added. Instead of inserting the sub-graphs in one step, it can be convenient to first insert a single node standing for the entire building block, and then to replace this node by the sub-graph itself. In fact, some of the nodes in FIG. 6 need to be expanded to a smaller grain size, e.g. by the addition of preparatory or setup tasks, before they can be executed by mechatronic systems. Examples of those nodes are the measure and exposure nodes, that comprise multiple elementary tasks, e.g. to measure one single mark or to expose one single die. The expansion of nodes into nodes of a smaller grain size by replacing them by building blocks is another automated planning step. Also some recipe-dependent steps can be distinguished. In the example, the generation of the sequence of exposure steps is one of those steps. Other examples can be found at the lower node grain size: the number of marks to measure or target portions to expose is also recipe dependent. However, also here building blocks can be distinguished: exposure of a substrate with a mask, measurement of a single mark or exposure of a target portion (die). A further automated planning step is precedence linking of nodes. For example, linking of sub-lives of some material instance (e.g. mask RA), or linking nodes of the same behavior type (e.g. 'T2A'). All planning or graph construction steps are executed only if the system state and the graph fulfill certain criteria. The sequence of construction steps including the applicable criteria can be regarded as planning rules.

This embodiment uses a set of generic graph construction functions as follows.

The replaceall function replaces all nodes in a precedence graph that fulfill some criteria by a sub-graph. The nodes that are replaced are called 'parent' nodes, whereas the nodes of the sub-graph are called 'child' nodes.

The insertall function inserts a sub-graph at all nodes that fulfill some criteria, called 'foster nodes'. The nodes in the inserted sub-graph are called 'orphan' nodes.

Furthermore, linking functions are defined to introduce precedence edges: linkmat to instantiate a precedence edge between sub-lives of material instances, and linkbeh to instantiate precedence edges between nodes of the same behavior type. As an example, a recipe-dependent generation function is described in the appendix. The domain-specific check that functions to determine e.g. whether a material instance is needed later on in the exposure sequence may also be provided. Such check functions require information concerning the graph constructed up to then, as well as the state of the system.

The system state S comprises 4 components:
Finish time of the last task per resource
Material configuration per resource
Physical state per resource
Manufacturing state per material instance.

During graph construction, a slightly modified TRS definition $D_{2c}$ is used. Differences with the instantiated, unselected system definition $D_2$ are:

$I_{2c}, Sb_{2c}, Se_{2c}, Cb_{2c}, Ce_{2c}$ are defined for nodes instead of for tasks.

Furthermore, for tracking of the construction process, two elements are introduced:

$Nr_{2c}:N_2 \rightarrow P(N_2)$ is an additional element giving parent-child relations between nodes $Ni_{2c}:N_2 \rightarrow P(N_2)$ is an additional element giving foster-orphan relations between nodes.

The plan rules need the behavior type of the nodes, e.g. 'T2A', 'exp', 'load substrate'. To define this, the following elements are introduced:

B is the set of all possible behavior types
$NB_{2c}:N_2 \rightarrow B$ gives for each node its behavior type.

Besides this, nodes carry some recipe parameters. From these parameters, building blocks can be generated and material instances can be instantiated.

$NP_{2c}:N_2 \rightarrow Pm$ is an additional element giving the parameters of the nodes.

Summarizing, the work dependent part of $D_{2c}$ is the set of all possible elements from the 17-tuple:

$(N_{2c}, L_{2c}, Ln_{2c}, G_{2c}, Gn_{2c}, Ga_{2c}, I_{2c}, Sb_{2c}, Se_{2c}, Cb_{2c}, Ce_{2c},$
$P_{2c}, Pt_{2c}, Nr_{2c}, Ni_{2c}, Nb_{2c}, Np_{2c})$

The starting point of the planning process is a construction system definition $D_{2c}$ containing the orders to plan as nodes in a precedence graph. This can be a sequence of order nodes representing an order queue, but if there are no priorities order nodes can also be modeled in parallel. After application of the planning rules, a more detailed system definition results, that is converted into an instantiated unselected system definition $D_{2c}$. In this conversion, the information that is not needed in $D_2$ is removed from $D_{2c}$. This concerns parent and foster node related elements and node behaviors. Furthermore, all nodes that are not clusters or groups become tasks. As this conversion is straightforward, the conversion function is not described herein. To determine to which nodes a construction step must be applied, the following functions are involved. Set C: $P(N_{2c} \times D_{2c} \times S) \rightarrow \mathbb{B}$ is a library of check functions $c_x$ that determine for some node given some system definition and system state whether certain criteria hold. Function nodestobehandled: $D_{2c} \times P(B) \times P(C) \times S \rightarrow P(N_{2c})$ is a function that determines which nodes are to be handled. In case they are used in a replace function, these nodes are called parent nodes, whereas these nodes are called foster nodes in case they are used in an insert function. The nodes to be handled are the nodes in an existing system definition $D_{2c}^e$ with a behavior that is in a set of behaviors br and for which condition checks cr hold in some system state sstate:

nodestobehandled $(D_{2c}^e, br, cr, sstate) =$
$\{n^e | n^e \in N_{2c}^e \wedge Nb(n^e) \in br \wedge (\forall c: c \in cr: c(n^e, D_{2c}^e, sstate))\}$ (1)

For generation of the exposure sequence, the node parameters need to contain part of the recipe information. The node parameters are a tuple of tuples containing a set of capabilities and a list of material instance sets $Np_{2c}:N_2 \rightarrow P(C) \times (P(M)^*)^2$. By convention, the first element of the tuple concerns substrates and the second element concerns masks. Furthermore, the sets of capabilities involved in substrate and mask processing are assumed to be disjunct. For the substrates as well as the masks, the capabilities involved in this type of material and the material instances themselves are described. A function that generates an exposure sequence using the node parameters, genes, is described further in an appendix hereto.

The nodes in a predefined basic building block are uninstantiated, implying that they have no material assigned to them. The nodes in a generated building block, that is generated using a basic building block, do have material assigned to them. The information required for that is obtained from the parameters of the parent node of the generated building block. In the actual replacement step, the material assigned to the nodes in the generated building block should be unchanged. In case of replacing a node by a basic building block or inserting a basic building block, material should be inherited from the parent or foster node. To assign material to a building block node, a function matassign is defined with a parameter m to define whether or not material should be obtained from the parameters np of a parent or foster node. Other parameters are the begin and the end material configuration of the building block node, cba and cbe, respectively.

Function matassign:$\mathbb{B} \times P(C \times P(M)) \times P(C \times P(M)) \times (P(C) \times P(M)^*)^2 \rightarrow P(C \times P)M)) \times P(C \times P(M))$ is defined as follows:

$$matassign(m, cba, cea, np) = \qquad (2)$$

$$\begin{cases} (cba, cea) \\ (\{(x.0, hd(y.1)) \mid x \in cba \land x.1 \neq \emptyset \land y \in \{np.0, np.1\} \land x.0 \in y.0 & \text{if} \neg m \\ \bigcup \{x \mid x \in cba \land x.1 = \emptyset\}, \\ (\{(x.0, hd(y.1)) \mid x \in cea \land x.1 \neq \emptyset \land y \in (np.0, np.1\} \land x.0 \in y.0\} & \text{if } m \\ \bigcup \{x \mid x \in cea \land x.1 = \emptyset\}) \end{cases}$$

If materials are not inherited, the begin and the end material configurations of a new node are copied from the building block called addition. If materials are inherited and (default) material is configured in the node of the addition, the set of material instances is inherited from the element of the parent node parameter that matches the involved capability, by taking the first element from the list. If no materials are configured in a node of the addition, this remains the same for the resulting instantiated material configuration of that node.

Using the functions defined above, the functions to replace nodes by building blocks and to insert building blocks can be defined. Let function replaceone $D_{2c}:N_{2c} \times D_{2c} \times \mathbb{B} \to D_{2c}$ be a function that replaces in an existing system definition $D_{2c}^e$ a parent node $n^e$ by an addition $D_{2c}^a$, taking into account whether involved materials either or not must be inherited (depending on the last parameter m). In the following, it is assumed that the nodes in the existing system definition $D_{2c}^e$, do not intersect the nodes in the addition $D_{2c}^a:N_{2c}^e \cap N_{2c}^a = \phi$. This might imply renaming of nodes in the addition.

Function replaceone can be defined as follows: replaceone $(D^{2ce}:n^e, D_{2c}^a, m) = D_{2c}^e$ such that $D_{2c}^{c'} = D_{2c}^e \cup D_{2c}^a$ where $D^{2ce} \cup D_{2c}^a$ is a pairwise union of all set definition elements except that:

$$(\forall n^{e'}: n^{e'} \in N_{2c}^a \qquad (3)$$

$$: (Cb_{2c}^{e'}(n^{e'}), Ce_{2c}^{e'}(n^{e'})) =$$

$$matassign(m, Cb_{2c}^{a'}(n^{e'}), Ce_{2c}^{a'}(n^{e'}), Np_{2c}^e(n^e))$$

$$\land ((\nexists n^a: n^a \in N_{2c}^a: n^a \in anc(n^{e'}) \lor (n^a, n^{e'}) \in P_{2c}^a)$$

$$\Rightarrow (\forall n: (n, n^e) \in P_{2c}^e : (n, n^{e'}) \in P_{2c}^{e'} \land (n, n^e) \notin P_{2c}^{e'})$$

$$\land (\forall n: (n, n^e) \in Pt_{2c}^e: (n, n^{e'}) \in Pt_{2c}^{e'} \land (n, n^e) \notin Pt_{2c}^{e'}))$$

$$\land ((\nexists n^a: n^a \in N_{2c}^a: n^a \in anc(n^{e'}) \lor (n^a, n^{e'}) \in P_{2c}^a)$$

$$\Rightarrow (\forall n: (n^e, n) \in P_{2c}^e: (n^{e'}, n) \in P_{2c}^{e'} \land (n^e, n) \notin P_{2c}^{e'})$$

$$\land (\forall n: (n^e, n) \in Pt_{2c}^e: (n^{e'}, n) \in Pt_{2c}^{e'} \land (n^e, n) \notin Pt_{2c}^{e'}))$$

$$\land Np_{2c}^{e'}(n^{e'}) = Np_{2c}^e(n^e)$$

$$\land n^{e'} \in Nr_{2c}^{e'}(n^e))$$

The system definition that results from function replaceone is the same as the union of the existing system definition and the addition, except for the assignment of involved material and the (strong) inheritance of precedence relations and parameters from the replaced parent node. The assignment of involved material is taken care of by function matassign. Concerning precedence relations, all top front nodes in the addition (i.e. at the top of the node hierarchy and the front of the precedence graph) inherit the (tied) precedence edges to the parent node, whereas all top rear nodes inherit the (tied) precedence edges from the parent node. The precedence edges to and from the parent node are deleted. Note that weak precedence inheritance can be useful. Furthermore, the nodes added are instantiated as children of the parent node.

Using this, function replaceall($D_{2c} \times P(N_{2c}) \times D_{2c} \times \mathbb{B} \to D_{2c}$) can be defined recursively:

$$replaceall(D_{2c}^e, N^{er}, D_{2c}^a, m) = \qquad (4)$$

$$\begin{cases} D_{2c}^e & \text{if } N^{er} = \emptyset \\ replaceall(replaceone(D_{2c}^e, N^{er}, D_{2c}^a, m), N^{er} \setminus \{n^{er}\}, D_{2c}^a, m) & \text{if } N^{er} \neq \emptyset \land n^{er} \in N^{er} \end{cases}$$

To replace all nodes in an existing system definition $D_{2c}^e$ with a behavior that is in a set of behaviors br and for which condition checks cr hold in some system state by some addition $D_{2c}^a$, whether or not inheriting involved materials (depending on m), the following expression can be used:

replaceall ($D_{2c}^a$, nodestobehandled($D_{2c}^a$,br,cr,systemstate), $D_{2c}^a$, m)

Let function insertone: $D_{2c} \times N_{2c} \times D_{2c} \times \mathbb{B} \times \mathbb{B} \times \mathbb{B} \times P(B) \to D_{2c}$ be a function that inserts in an existing system definition $D^{2ce}$ before or after a foster node $n^e$ (depending on b) see (system definition below) in addition $D_{2c}^a$. It takes into account whether involved materials must be inherited from $n^e$ (depending on m), and whether the precedence relation to the foster must be tied (depending on tied). The addition is inserted in between the foster node and the nodes preceding or succeeding the foster node (depending on b) if their behavior is in or: the 'opposite' nodes. Function insertone_ can be defined as follows: insertone($D_{2c}^e, n^e, D_{2c}^a, m, b, tied, or$)=$D_{2c}^{e'}$ such that $D_{2c}^{e'} = D_{2c}^e \cup D_{2c}^a$ except that:

$$(\forall n^{e'}: n^{e'} \in \mathcal{N}_{2c}^a$$

$$: (Cb_{2c}^{e'}(n^{e'}), Ce_{2c}^{e'}(n^{e'})) =$$

$$matassign(m, Cb_{2c}^{e'}(n^{e'}), Ce_{2c}^{a}(n^{e'}), Np_{2c}^{e}(n^{e}))$$

$$\wedge (b \wedge (\nexists n^a: n^a \in \mathcal{N}_{2c}^a: n^a \in anc(n^{e'}) \vee (n^{e'}, n^a) \in P_{2c}^a)$$

$$\Rightarrow (n^{e'}, n^e) \in P_{2c}^{e'} \wedge (tied \Rightarrow (n^{e'}, n^e) \in Pt_{2c}^{e'}))$$

$$\wedge (b \wedge (\nexists n^a: n^a \mathcal{N}_{2c}^a: n^a \in anc(n^{e'}) \vee (n^a, n^{e'}) \in P_{2c}^a)$$

$$\Rightarrow (\forall n: (n, n^e) \in P_{2c}^{e'} \wedge Np_{2c}^{e'}(n) \in \text{ or}: (n, n^{e'}) \in P_{2c}^{e'} \wedge (n, n^e \notin P_{2c}^{e'})$$

$$\wedge (\forall n: (n, n^e) \in Pt_{2c}^{e} \wedge Np_{2c}^{e}(n) \in \text{ or}: (n, n^{e'}) \in Pt_{2c}^{e'}(n, n^e) \notin Pt_{2c}^{e'}))$$

$$\wedge (\neg b \wedge (\nexists n^a: n^a \in \mathcal{N}_{2c}^a: n^a \in anc(n^{e'}) \vee (n^a, n^{e'}) \in P_{2c}^a)$$

$$\Rightarrow (n^e, n^{e'}) \in P_{2c}^{e'} \wedge (tied \Rightarrow (n^e, n^{e'}) \in Pt_{2c}^{e'}))$$

$$\wedge (\neg b \wedge (\nexists n^a: n^a \in \mathcal{N}_{2c}^a: n^a \in anc(n^{e'}) \vee (n^{e'}, n^a) \in P_{2c}^a)$$

$$\Rightarrow (\forall n: (n^e, n) \in P_{2c}^e \wedge Np_{2c}^e(n) \in \text{ or}: (n^{e'}, n) \in P_{2c}^{e'} \wedge (n^e, n \notin P_{2c}^{e'})$$

$$\wedge (\forall n: (n^e, n) \in Pt_{2c}^e \wedge Np_{2c}^e(n) \in \text{ or}: (n^{e'}, n) \in Pt_{2c}^{e'} \wedge (n^e, n) \in Pt_{2c}^{e'}))$$

$$\wedge Np_{2c}^{e'}(n^{e'}) = Np_{2c}^e(n^e)$$

$$\wedge n^{e'} \in Ni_{2c}^{e'}(n^e))$$

Function insertone resembles replaceone except for the precedence relations. In case the insertion is done before the foster node, all top rear nodes of the addition get a (tied if applicable) precedence edge to the foster node. Furthermore, precedence edges are inherited from the opposite nodes to all top front nodes of the addition. In case the insertion is done after (not before) the foster node, the precedence edges are instantiated the other way round.

Using this function insertall $D_{2c} \times P(N_{2c}) \times D_{2c} \times \mathbb{B} \times \mathbb{B} \times P(B \times \mathbb{B}) \times P(B) \to D_{2c}$ can be defined recursively:

$$insertall: D_{2c}^e, N^{ei}, D_{2c}^a, m, b, brt, \text{or}) =$$

$$\begin{cases} D_{2c}^e & \text{if } N^{er} = \emptyset \\ & \text{if } N^{er} \neq \emptyset \\ & \wedge n^{ei} \in \mathcal{N}^{ei} \\ insertall(insertone(D_{2c}^e, n^{ei}, D_{2c}^a, m, b, bt.1, \text{or}), N^{ei} \setminus \{n^{ei}\}, D_{2c}^a, m, b, brt, \text{or}) & \wedge bt \in brt \\ & \wedge bt.0 = Nb_{2c}^e(n^{ei}) \end{cases}$$
(6)

Where tuples in $brt \subseteq B \times \mathbb{B}$ define the behaviors of the foster nodes and whether or not the precedence relation to the foster node must be tied.

To insert some addition $D_{2c}^a$ in an existing system definition $D_{2c}^e$ before or after (depending on b) all foster nodes, whether or not inheriting involved materials (depending on m), and whether or not in between opposite nodes with behavior in or preceding or succeeding the foster nodes, the following expression can be used:

insertall:$D_{2c}^e$,nodestobehanaled($D_{2c}^e$,{bt.0|bt∈brt},cr, systemstate),$D_{2c}^a$, m,b,brt,or).

To link the sub-lives of material instances, first the sub-lives are extracted from the system definition using function $P_{2m}$: $D_{2c} \times M_{2c} \to P(N_{2c} \times N_{2c})$. Function $P_{2m}$ is a function describing for a material $m \in M_{2c}$ in a TRS definition $D_{2c}^e \in D_{2c}$, a precedence relation between related nodes without redundant edges:

$$P_{2m}: (D_{2c}^e, m) = \qquad (7)$$

$$\{(n, n') \mid (n, n') \in \mathcal{P}_{2c}^e \wedge \{cm.0 \mid cm \in Ce_{2c}(n), m \in cm.1\} =$$

$$\{cm.0 \mid cm \in Cb_{2c}(n'), m \in cm.1\} \wedge \neg \text{ redundant } (n, n', P_{2c}^e)\}$$

Where function redundant: $N_{2c} \times N_{2c} \times P_{2c} \to \mathbb{B}$ determines whether a precedence edge (n,n') is redundant in a precedence relation P:

$$\text{redundant}(n, n', P) = (\exists n'': n'' \in N_{2c} \wedge n'' \neq n \wedge n'' \neq n':$$
$$\text{path}(n, n'', P) \wedge \text{path}(n'', n', P)) \qquad (8)$$

Function path $N_{2c} \times N_{2c} \times P_{2c} \to \mathbb{B}$ used above determines whether there is a path between two nodes n and n' in a precedence relation P:

$$\text{path}(n, n', P) = \begin{cases} \text{true} & \text{if } n \in \{n'\} \cup anc(n') \quad \text{if } n \in \{n'\} \cup anc(n') \\ (\exists n'', n''': n''' \in \{n\} \cup anc(n) \wedge (n''', n'') \in P: \text{path}(n'', n', p)) & \text{if } n \notin \{n'\} \cup anc(n') \end{cases} \qquad (9)$$

Function linkmat:$D_{2c} \times \mathbb{B} \to D_{2c}$ is a function that links the sub-lives of material instances together in the same order as the associated nodes of primary behavior pb∈B.

linkmat:$(D_{2c}^e, pb) = D_{2c}^{e'}$ such that $D_{2c}^{e'} = D_{2c}^e$ except that:

$$(\forall\, m, n, n' : m \in M_{2c}^e, n, n' \in N_{2c}^e, \quad (10)$$

$$(\nexists n'' : n'' \in N_{2c}^e : (n, n'') \in P_{2m}(D_{2c}^e, m) \wedge (n'', n') \in P_{2m}(D_{2c}^e, m)),$$

$$(\exists n'', n''' : n'', n''' \in N_{2c}^e, Nb_{2c}^e(n'') = pb,$$

$$Nb_{2c}^e(n''') = pb : \text{path}(n'', n''', P_{2c}^e) \wedge \text{path}$$

$$(n'', n, p_{2c}^e) \wedge \text{path}(n', n''', P_{2c}^e)) : (n, n') \in P_{2c}^{e'}$$

Function linkbeh:$(D_{2c} \times P(B \times \mathbb{B}) \times B \to D_{2c}$ is a function that links tasks with a certain behavior together in the same order as the associated nodes of primary behavior pb∈B. The function takes the behaviors in the first elements of the tuples in set bpr∈P(B×𝔹) into account, where the second element of each tuple indicates whether the behavior concerns pre-processing or post-processing (true or false, respectively).

linkbeh:$(D_{2c}^e, bpr, pb) = D_{2c}^{e'}$ such that $D_{2c}^{e'} = D_{2c}^e$ except that:

$$(\forall\, b, p, n, n' : (b, p) \in bpr, n, n' \in N_{2c}^e, \quad (11)$$

$$Nb_{2c}^e(n) = b, Nb_{2c}^e(n') = b \wedge (\exists n'', n''' : n'', n''' \in N_{2c}^e,$$

$$Nb_{2c}^e(n'') = pb, Nb_{2c}^e(n''') = cb, \text{path}(n', n''', P_{2c}^e) :$$

$$(p \wedge \text{path}(n, n'', P_{2c}^e) \wedge \text{path}(n', n''', P_{2c}^e)) \vee$$

$$(\neg\, p \wedge \text{path}(n', n, P_{2c}^e) \wedge \text{path})n'',$$

$$n', P_{2c}^e)))) : (n, n') \in P_{2c}^{e'})$$

The automatic planning functions described can be illustrated for the typical example order 1.

Planning involves application of the following sequence of planning rules:

1) First, the order node is replaced by an exposure sequence that is generated from the parameters of the order node using function genes.

The function call is as follows:

replaceall($D_{2c}^e$,nodestobehandled($D_{2c}^e$,{n1},{$c_0$}), genes($D_{2c}^a$, false,Np(n1),2,2,$D_{2c}^\epsilon$)),false)

Here:
$D_{2c}^e$ is the existing system definition, containing the node of order 1, n1 at that moment.
$c_0$ is a dummy check function that always returns true.
$D_{2c}^a$ is the system definition of the building block containing one exposure node.
$D_{2c}^\epsilon$ is the empty system definition.

2) Then, a 'load substrate' is inserted before each node of behavior 'exp' that fulfills the following criteria:
a) not preceded by a 'mea' node yet, and
b) not preceded by a node of behavior 'exp' involving the same substrate, and
c) the substrate is not present at a substrate table yet.

The function call is as follows:

insertall($D_{2c}^e$,nodestobehandled($D_{2c}^e$,{'exp'},{$c_a$,$c_b$, $c_c$}, systemstate)$D_{2c}^{\text{'load—wafer'}}$, true,true,{ ('exp',false)},{})

Here:
$D_{2c}^e$ is the existing system definition, the result of planning step 1
$c_a$,$c_b$,$c_c$ are the check functions implementing criteria a through c listed above 3) An 'unload substrate' is inserted after each node of behavior 'exp' that fulfills the following criteria:
a) not succeeded by a 'C2U' node yet, and
b) not succeeded by a node of behavior 'exp' involving the same substrate.

4) A 'load mask' is inserted before each node of behavior 'exp' that fulfills the following criteria:
a) not preceded by a 'E2S' yet, and
b) not preceded by a node of behavior 'exp' involving the same mask, and
c) the mask is not present at the stage yet.

5) An 'unload mask' is inserted after each node of behavior 'exp' that fulfills the following criteria:
a) not succeeded by a 'E2S' yet, and
b) not succeeded by a node of behavior 'exp' involving the same mask.

6) A 'preload mask' is inserted before each node of behavior 'E2S' that fulfills the following criteria:
a) not preceded by a 'R2E' yet, and
b) the mask is not left at an elevator after an earlier expose and mask unload, and
c) the mask is not present at an elevator yet.

7) A 'post unload mask' is inserted after each node of behavior 'S2E' that fulfills the following criteria:
a) not succeeded by a 'E2R' yet, and
b) not needed for a later 'exp', and
c) the mask is not present at an elevator yet.

Note: these rules are sufficient for this example, and the other examples discussed below. To avoid violation of the material capacity of the elevators in all situations, additional rules for mask pre loads and post unloads should be added.

8) The material sub-lives are linked together around the exposure sequence using linkmat($D_{2c}^e$, 'exp').

9) Precedence edges between consecutive nodes of the same behavior are added using linkbeh($D_{2c}^e$,{('P2R',true), ('E2S',true), ('T2A',true), ('D2T',false)}).

10) The construction system definition is converted into an instantiated unselected system definition.

Figure 7:
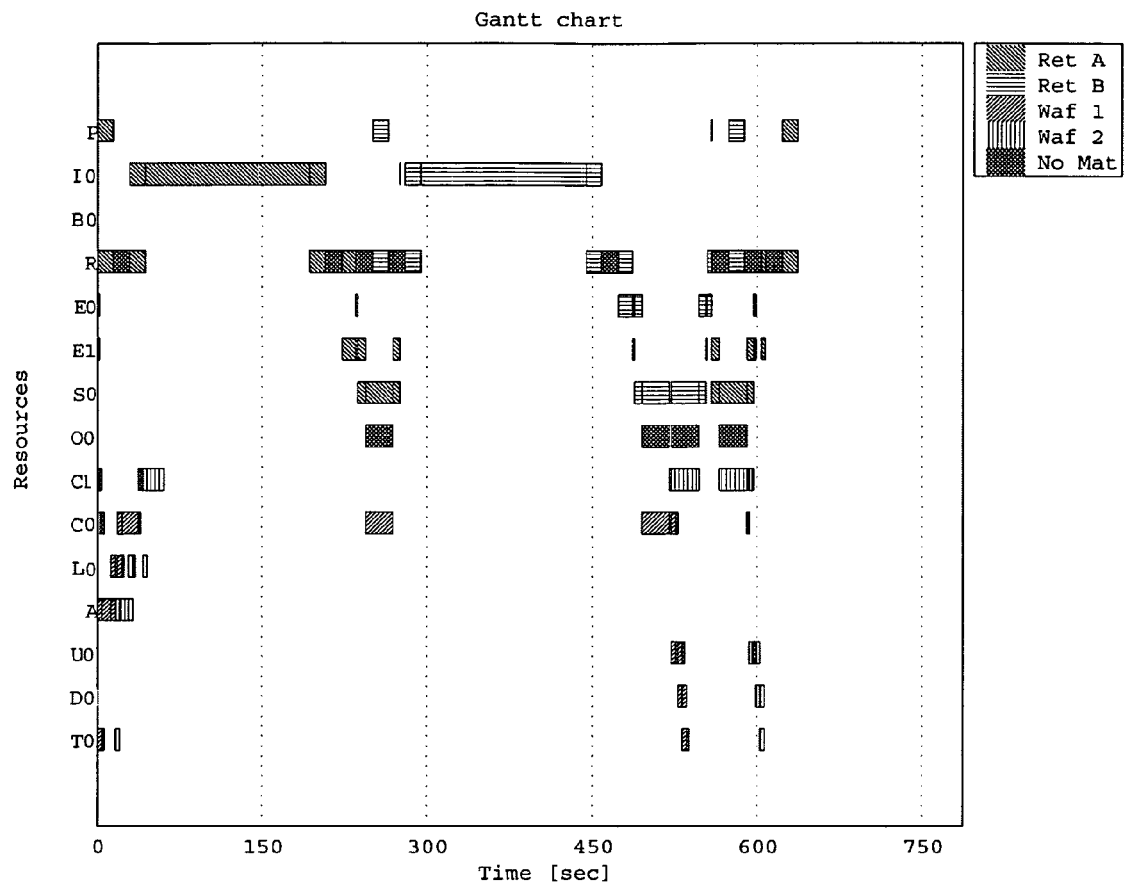
FIG. 7 is a Gantt chart of an example task schedule generated by a method according to an embodiment of the invention.

The result of these 10 planning steps matches FIG. 6. In FIG. 7, a schedule for order 1 is shown.

Figure 8:
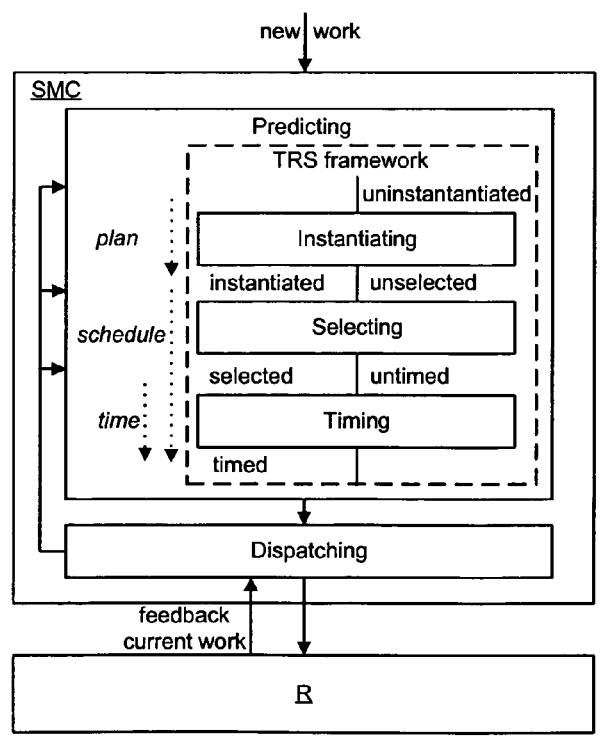
FIG. 8 depicts a supervisory machine control system according to an embodiment of the invention.

A supervisory machine control system SMC embodying the TRS framework according to an embodiment of the invention is shown in FIG. 8. The SMC reacts to triggers from its environment. These triggers can originate from the user as well as from the machine resources (feedback) and may require revision of the schedule. Two categories of trigger originate from the machine resources: current work delays and exceptions occurring. The other category of trigger originates from the user: new work arrives. Reacting to the triggers, the SMC generates a revised schedule, using the functionalities and definitions described below.

The SMC framework comprises 2 parts: predicting and dispatching. The predicting part accommodates the predictive scheduling functionality, that translates triggers into schedules. The dispatching part is the real-time part, that connects the predictive part to the resources. The main functionality of this part is dispatching the scheduled tasks to the resources. In the predictive part, the layered TRS framework is embedded (see the dashed box), which is implemented by three transformation functions: plan, schedule, and time. The plan function is explained above and implements the instantiating transformation. The time function implements the timing transformation, whereas the schedule function implements both the selecting and the timing transformations.

An important desirable is minimization of control overhead. Therefore, reaction or predicting activity should take place in the shadow of real-time activity if possible. For this reason, the part of the schedule being executed in the dispatcher that can run in parallel with reaction activities to adapt the schedule is not revised. When following the complete trajectory from the arrival of an order up to the moment at which the work is finished, the following phases of the work are distinguished:

Work Ordered, WO.
Work Planned, WP.
Work Scheduled, WS.
Work to be Dispatched, WD: this is the part of the work that is not yet in progress, but is scheduled to be in progress (safe bound) after reaction activity (including ties). Reaction takes place in the (time) shadow of the execution of WD.
Work In Progress, WI.
Work Executed, WE.
Work Finished, WF: this is the part of the work executed that does not matter anymore: all successors of this part of the work are executed. This 'history' is not required for control anymore and can be removed.

A scheduled task $D_0$ can be in WS, WD, WI, WE, or WF, whereas nodes in a plan ($D_2$, $D_{2c}$) can also be in WO or WP.

By convention, the phases concerned in part of a definition are denoted in superscript, e.g. $D_0^{id}$ denotes the part of a schedule (0 in subscript) that is in process or will be dispatched (id in superscript).

In this section, a plan function is used without any configuration parameters, thus abbreviating the functionality of the previous section: plan(initstate, $D_{2c}$)=$D_2^p$. Furthermore, a schedule and a time function that have a history schedule $D_0^h$ as a parameter are used. This history schedule is needed to avoid violation of precedence relations crossing the initial state (time contour): schedule($D_0^h$,initstate,$D_2^t$,$D_2$)=($D_0^s$,$D_1^s$,endstate). Here, $D_2$ is the (unselected) definition of the work to be scheduled, and $D_2^t$ is the total definition concerning both the history schedule and the work to be scheduled: time: ($D_0^h$,initstate,$D_1'$,$D_1$)=($D_0^t$,endstate). Here $D_1$ is the (selected) definition of the be timed, and $D_1^t$ is the total selection concerning both the history schedule and the work to be timed.

Moreover, partitions of total system definitions are needed as parameters for the plan, time and schedule functions, depending on the required phases. To this end, extraction functions are used to extract from total definitions the partition concerning a certain set of nodes. The format of the extraction functions is as follows:

extract2c is a function that extracts from an unselected TRS definition $D_{2c}$ the part that is related to a set of nodes N: extract2c($D_{2c}$,N)=$D_{2c}^e$ extract2 is a function that extracts from an unselected TRS definition $D_{2c}$ the part that is related to a set of nodes N: extract2($D_2$,N)=$D_2^e$ extract1 is a function that extracts from a selected TRS definition $D_1$ the part that is related to a set of tasks T: extract1($D_1$, T)=$D_1^e$ extract0 is a function that extracts from a timed TRS definition $D_0$ the part that is related to a set of tasks T: extract0($D_0$, T)=$D_0^e$. A TRS definition $D_0$ comprises two types of tasks: core tasks and setup tasks. Core tasks also exist in the higher TRS definition levels, and setup tasks are added to make sure that the physical resource end states of tasks match the resource start states of consecutive tasks.

For various reasons, the actual duration of tasks can differ from the scheduled predicted durations. To be robust for that, three guard conditions are checked before dispatching a task:

1) Is the task start time reached?
2) Are the involved resources idle?
3) Are the preceding tasks finished?

Figure 9:
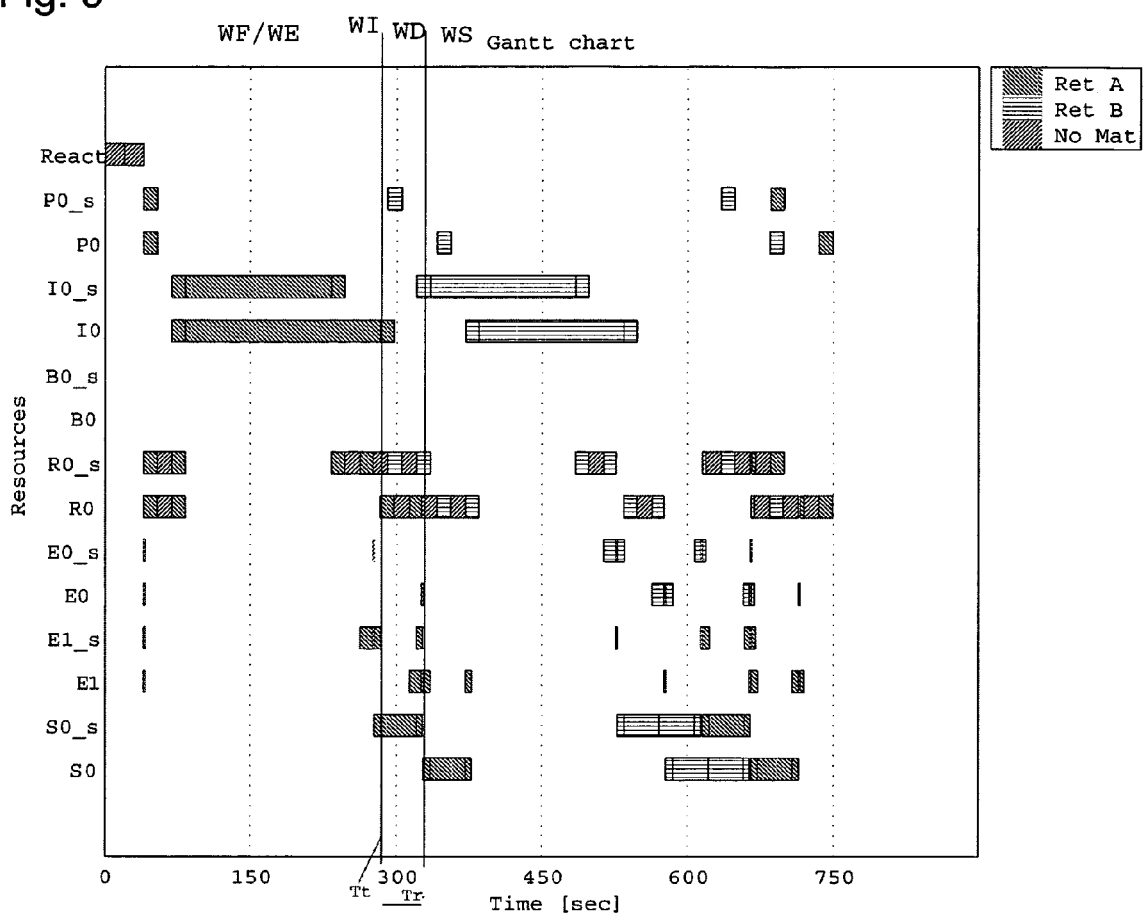
FIG. 9 is a Gantt chart of a second example task schedule generated by a method according to an embodiment of the invention, showing scheduled vs. actual timings.

The first condition ensures that there is no effect of tasks taking less time for the rest of the actual execution. However, tasks taking more time than scheduled can cause the scheduled prediction to be out of sync with actual execution. In FIG. 9, this effect is illustrated for a delay of the inspection of mask RA in order 1. The scheduled timing is depicted at the resources with a '_s' extension, whereas the actual timing is depicted at the resources without extension.

The fact that the remaining predicted schedule is out of sync with reality may result in violations of time window constraints or sub optimality. Therefore, the actual finish of the delayed task could form a trigger for revision of the schedule. In FIG. 9, the trigger time, Tt, and the (worst case) duration of the reaction, Tr, are depicted with vertical lines. The tasks scheduled to start before the finish of the reaction form the work to be dispatched (WD in FIG. 9), which is not revised. The work scheduled (WS in FIG. 9) is withdrawn from the dispatcher and is returned after revision.

Two reaction scenarios are defined for this type of trigger originating from the current work:

C1a Update current work, re-time
C1b Update current work, re-schedule

Both scenarios comprise two steps:

1) The purpose of the first step is to get a good starting point for revision of the work scheduled (WS). This is done by re-timing the work up to the work to be dispatched (a), and accounting for the reaction time (b).

a) First the work to be re-timed is to be determined, which comprises WI up to WD. The set of timed tasks covering $D^{oid}$,$T_0^{id}$ is determined in three steps:

i) Determine the core tasks after WI that are scheduled to be in progress after the reaction time, $T_2^d$,$T_1^d$ $$T_2^d = \{t | t \in T_2 \setminus T_0^e \cup T_0^i), \tau_{s0}(t) < (t_t + t_r)\}$$

ii) Determine the core tasks $T_2^t$ that are tied to $T_0^e$,$T_1^i$ or $T_2^d$:

$$T_2^d = \{t | t \in T_2, (\exists t': t' \in (T_0^e \cup T_0^i \cup T_2^d) : \text{path}(t',t,Pt_2))\}$$

iii) Include the setup tasks $T_0^{idt}$ in between $T_0^e$,$T_0^i$,$T_2^d$ and $T_2^t$:

$$T_2^{idt} = \{t | t \in T_0, (\exists t',t'':t' \in (T_0^e \cup T_0^i \cup T_2^d), t'' \in (T_2^d \cup T_2^t) : \text{path}(t',t,P_1) \wedge \text{path}(t,t'',P_1)\}$$

Then $T_0^{id} = T_0^i \cup T_2^d \cup T_2^t \cup T_0^{idt}$

With time($D_0^e$,Estate,$D_1$,$D_1^{id}$) the work up to WD is re-timed where:

$D_0^e$=extract0($D_0$,$T_0^e$)

Estate is the state after WE $D_1$ comprises at least WE until WD (as WS is also allowed no extraction is needed)

$D_1^{id}$=extract1($D_1$,$T_0^{id}$)

b) As the work thereafter can never start earlier than ($t_t+t_r$), the state after this work is to be updated with respect to the finish contour:

$Dstate'=Dstate$ except that ($\forall r$:$r \in R$:finish($r$)=max(finish($r$),$t_t+t_r$))

2) The purpose of the second step is to re-time (C1a) or re-schedule (C1b) the work scheduled.

C1a With time($D_0^{id}$,Dstate',$D_1$,$D_1^s$) the rest of the current work is re-timed where:

$D_0^{id}$=extract0($D_0$,$T_0^{id}$)

Dstate' is the state after WD including reaction time, resulting from step 1.

$D_1^s$=extract1($D_1$,($T_0\setminus(T_0^e \cup T_0^{id})$))

C1b With schedule($D_0^{id}$,Dstate',$D_2$,$D_2^s$) the rest of the current work is re-scheduled, where:

$D_2^s$=extract2($D_2$,{n|n∈$N_2$\(anc($T_0^e \cup T_0^{id}$)$\cup T_0^e \cup T_0^{id}$)})

Figure 10:
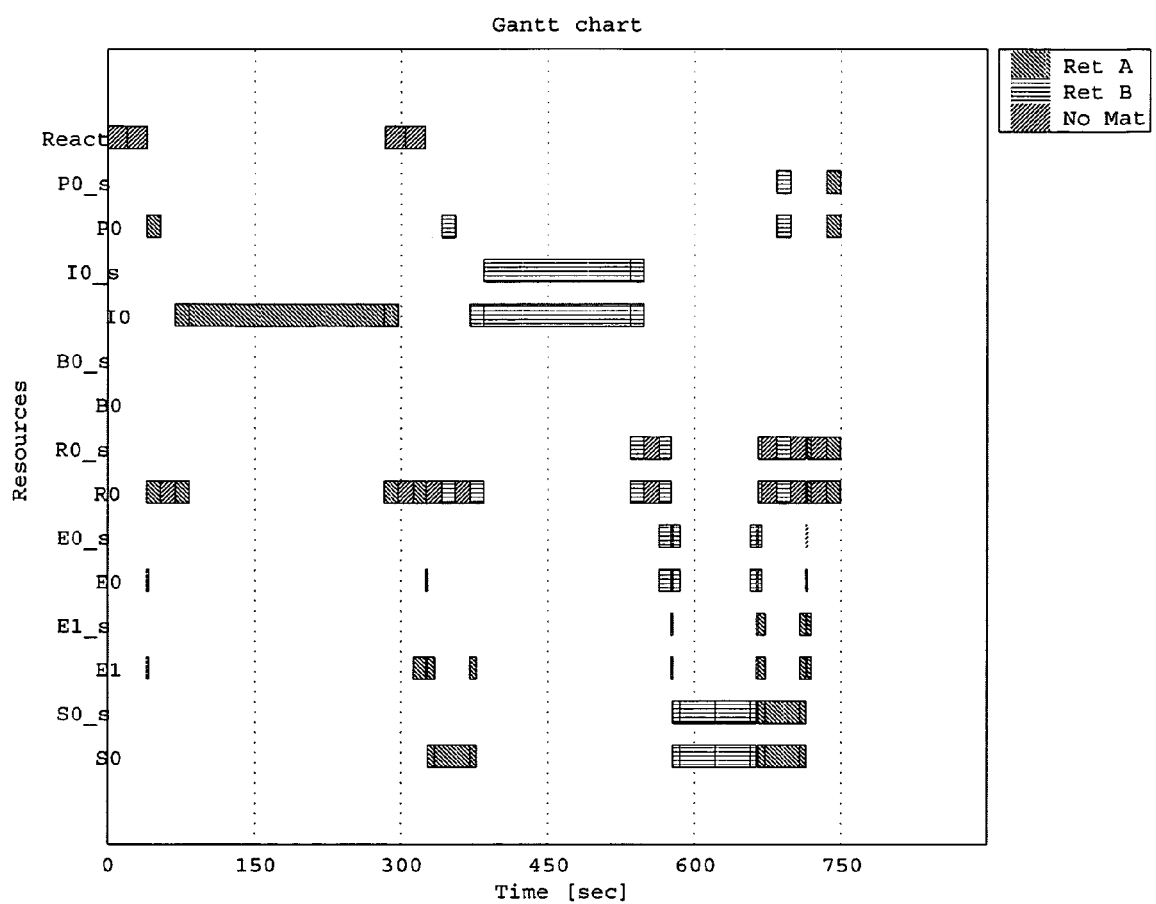
FIG. 10 is a Gantt chart of a third example task schedule generated by a method according to an embodiment of the invention, showing the results of updating the schedule.

FIG. 10 shows the revised schedule that is in sync with reality again.

At any time, the user can give triggers involving new work, or revision of the current work. Allowed revision of the current work concerns removal or shuffling priorities of orders that are predicted, but not yet in process. Therefore, such revision triggers can be handled by deleting the corresponding prediction and adding new work. The mask view of another example order (order 2) is used for illustration. This trigger is received at time=550 sec, and requests exposure of two substrates according to the 'ABBA' pattern again, but now with masks RB and RC, respectively.

To react on triggers from the user implying adding new work, six reaction scenarios are defined:

N1a Add new work without current work. The machine is idle when the new work is added in this case, which is explained in the previous section.

N1b Add new work with current work, no revision of current work. In this case, previously ordered work is still being executed, but its schedule is not revised.

N2a Add new work, re-time current work. In this case, part of the previously ordered work is re-timed such that actual execution is in sync with the schedule again.

N2b Add new work, re-schedule current work. In this case, part of the previously ordered work is re-scheduled together with the new work.

N3a Add new work, re-plan current work. In this case, part of the previously ordered work is re-planned together with the new work.

N3b Add new work, re-order current work. In this case, part of the previously ordered work is re-ordered together with the new work. This way, orders can be skipped and their priority can be changed.

Scenario N1a is described in the previous section. Scenario N1b, add new work with current work, has two steps:

1) The plan for the new work (order 2), $D_2^p$, is determined from the state after the current scheduled work Sstate and the order definition $D_{2c}^o$:

$D_2^p$=plan0(Sstate,$D_{2c}^o$)

The resulting precedence graph for order 2 is similar to the precedence graph for order 1 in FIG. 5, with substrate W1 and W2 replaced by W3 and W4, and mask RA and RB replaced by RB and RC, respectively.

2) The schedule for the new work is determined as follows assuming no intra-resource precedence relations between current and new work:

schedule(∅,Sstate,$D_2^p$,$D_2^p$)

Figure 11:
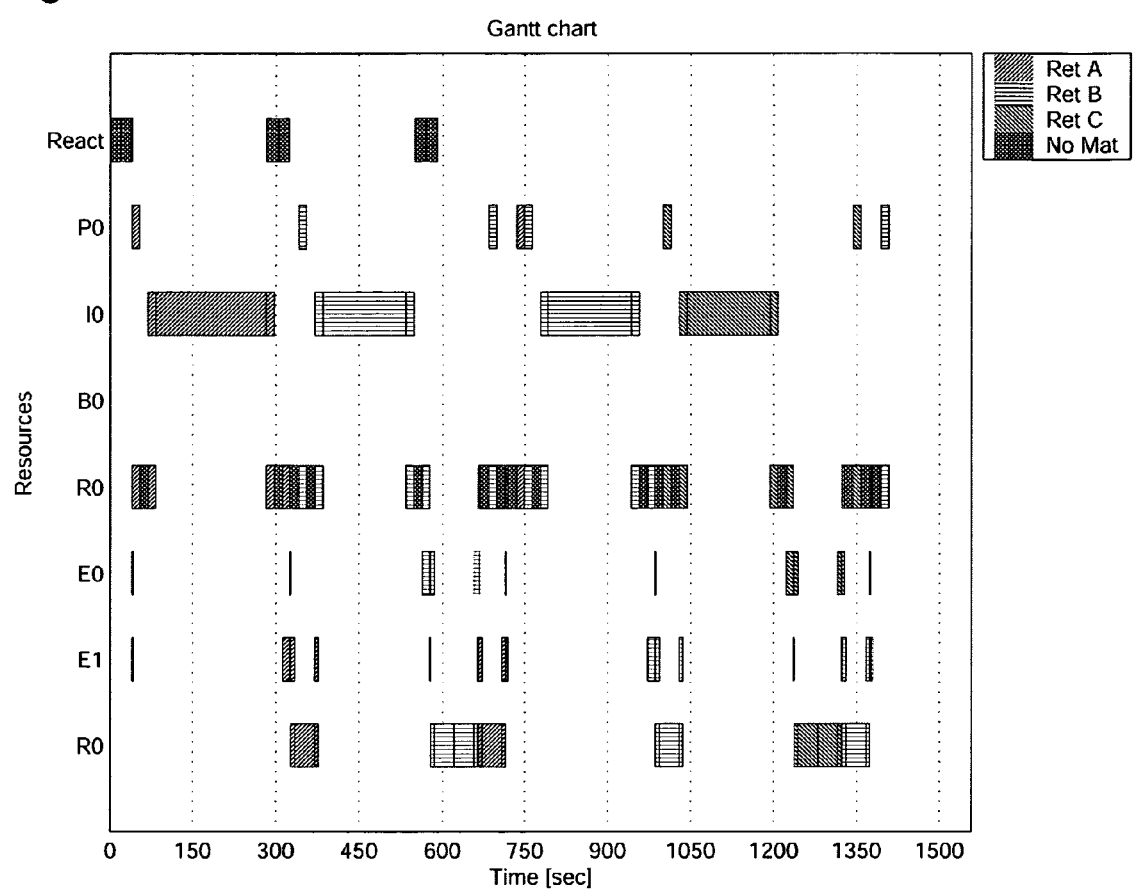
FIG. 11 is a Gantt chart of a fourth example task schedule generated by a method according to an embodiment of the invention.

In FIG. 11, the schedule resulting from this reaction for the example trigger is depicted.

Scenarios N2a and N2b (N2): add new work, re-time or re-schedule current work, are a combination of C1 and N1, involving three steps.

1) First, a scheduling step as described for the C1 scenarios is performed.

2) Besides this, a plan step comprising 2 sub steps is done:
  a) Insert the new order (no) after the existing plan, resulting in $D_{2c}^{eids\&no}$
  b) Plan the result $D_{2c}^{eids\&np}$=plan(Fstate,$D_{2c}^{eids\&no}$), where Fstate is the state after WF.

3) Here, a distinction is to be made between cases N2a and N2b.

N2a: The remainder of the current work is re-timed like in the second step of C1a:

($D_0^s$,Sstate)=time($D_0^{id}$,Dstate,$D_2^{eids\&np}$,$D_1^s$)

Subsequently, the new work is scheduled:

schedule($D_0^{ids}$,Sstate,$D_2^{eids\&np}$,$D_{2np}$)

The schedule for the example resulting from this reaction is equal to FIG. 10, as re-timing had no effect.

N2b: In case N2b, the remainder of all work is re-scheduled:

schedule($D_o^{id}$,Dstate,$D_2^{eids\&np}$,$D_2^{s\&np}$)

Figure 12:
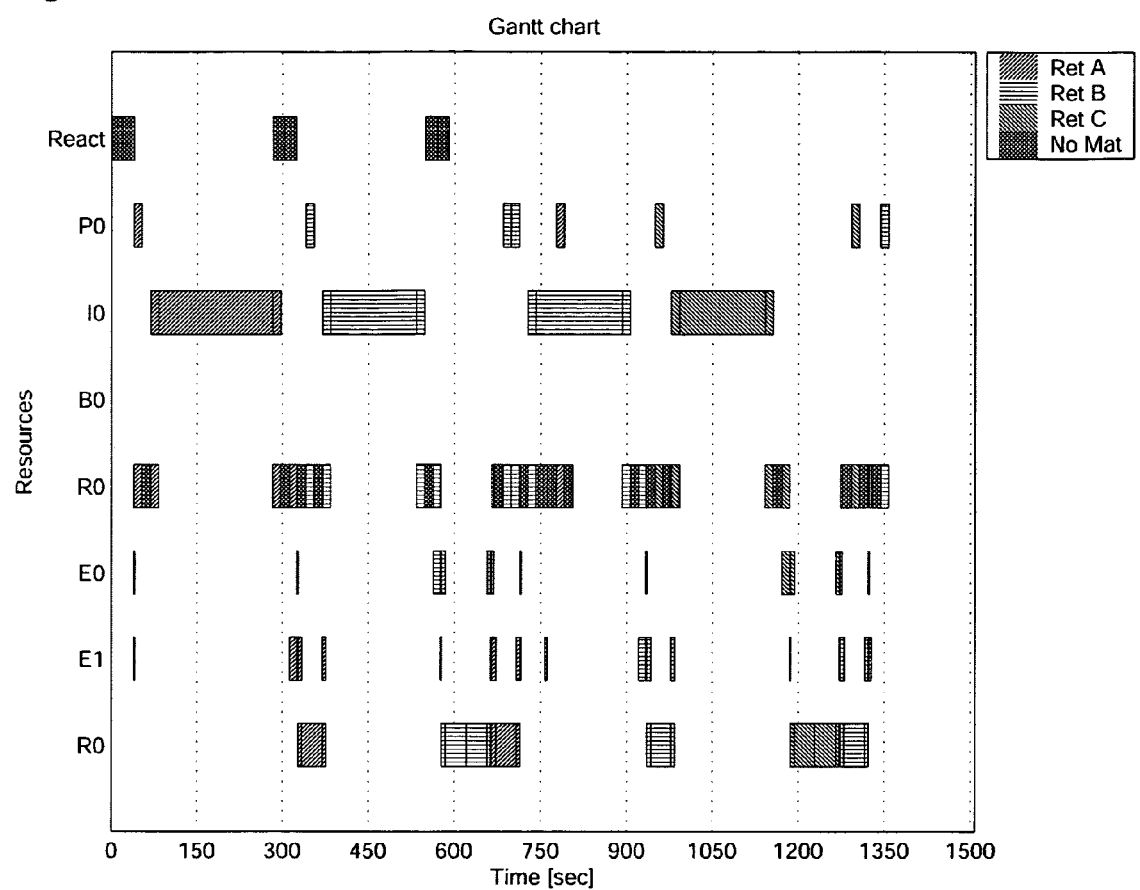
FIG. 12 is a Gantt chart of a fifth example task schedule generated by a method according to an embodiment of the invention.

In FIG. 12, the schedule resulting from this reaction for the example trigger is depicted. This schedule is finished earlier than the schedule in FIG. 11, as the two orders are interweaved now during rescheduling.

Figure 13:
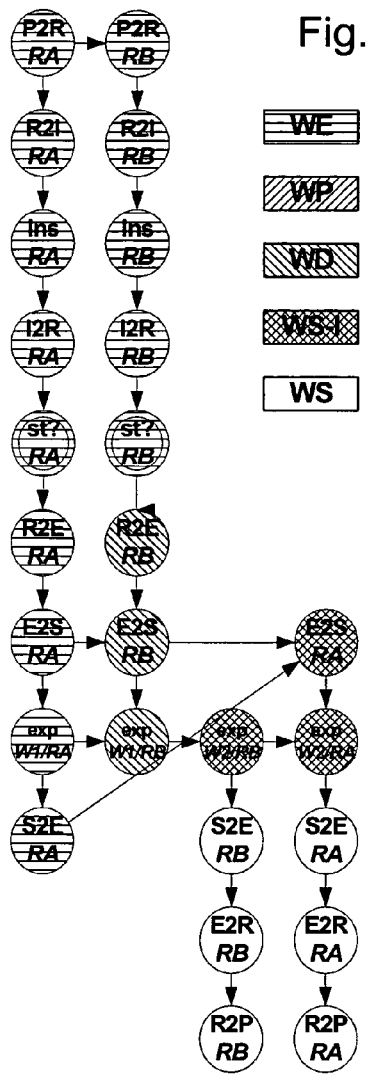
FIG. 13 is a precedence graph showing the state of the apparatus at the time of arrival of a new order in an example process planned by a method according to an embodiment of the invention.

In the N3 scenarios: add new work, re-plan or re-order current work, besides the work that will not be rescheduled as it remains in the dispatcher (up to WD), there is work that will not be re-planned. This is the part of the work scheduled that is generated using the same planning step as work that is in the work up to WD. This part of the work scheduled is called the initiated work scheduled. For the example, the status of the nodes in the precedence graph of FIG. 13 at the arrival of order 2 is depicted including the initiated part of WS, WS-I.

To differentiate the initiated nodes in WS, we define some functions.

Let nodeeid: ($N_{2c}$,$T_0^{eid}$,$D_{2c}$)→𝔹 be a function that determines whether a node n is an executed, in progress or to be dispatched task, or an ancestor of one, or a parent of nodes that all are:

$$nodeeid : (n, T_0^{eid}, D_{2c}) = (n \in T_0^{eid} \vee n \in \quad (12)$$
$$ancl(T_0^{eid}) \vee Nr_{2c}(n) \neq \emptyset \wedge (\forall\, n' : n' \in Nr_{2c}(n) : nodeeid(n')\})$$

Let nodeeid: ($N_{2c}$,$T_0^{eid}$,$D_{2c}$)→𝔹 be a function that determines whether a node n is initiated, defined by:

$$nodeinit : (n_{2c}, T_0^{eid}, D_{2c}) = \quad (13)$$
$$(\exists\, n' : n' \in Nr_{2c}(n) \cup Ni_{2c}(n) : nodeeid(n', T_0^{eid}) \vee$$
$$nodeinit(n', T_0^{eid})) \vee$$
$$(\exists\, n' : n'' : n \in Nr_{2c}(n') \cup Ni_{2c}(n'), n'' \in Nr_{2c}(n') \cup Ni_{2c}(n')\backslash\{n\} :$$
$$nodeeid(n'', T_0^{eid}) \vee nodeinit(n'', T_0^{eid}) \vee$$
$$(\exists\, n' : n \in Ni_{2c}(n') : nodeid(n', T_0^{eid})) \vee$$
$$(\exists\, n' : n \in succ(n) : nodeinit(n', T_0^{eid}))$$

Then $N_{2c}^{eid}$ can be defined by $N_{2c}^{eid}$={n|n∈$N_{2c}$,nodeeid(n,$T_0^{eid}$, $D_{2c}$)} and the initiated nodes $N_{2c}^{init}$, can be defined by: $N_{2c}^{init}$={n|n∈$N_{2c}\setminus N_{2c}^{eid}$, nodeinit(n, $T_0^{eid}$, $D_{2c}$)}.

Using this, the add new work, re-plan (N3a) or re-order (N3b) current work trigger can be handled in three steps (like N2):

1) A scheduling step as described for the C1 scenarios is performed.

2) Besides this (not necessarily after), a plan of the remainder is derived in four substeps:

a) Derive the work up to the initiated work using extract2c $(D_{2c}, N_{2c}^{eid} \cup N_0^{init})$ b) Insert after the initiated work the non-initiated order nodes of the current work $D_{2c}^{co}$ (see N2 step 2a): $N_{2c}^{o} \backslash N_{2c}^{eid} \backslash N_{2c}^{init}$. If required (N3b) in another precedence order.

c) Insert after this the new orders $D_{2c}^{no}$ (if any)

Figure 14:
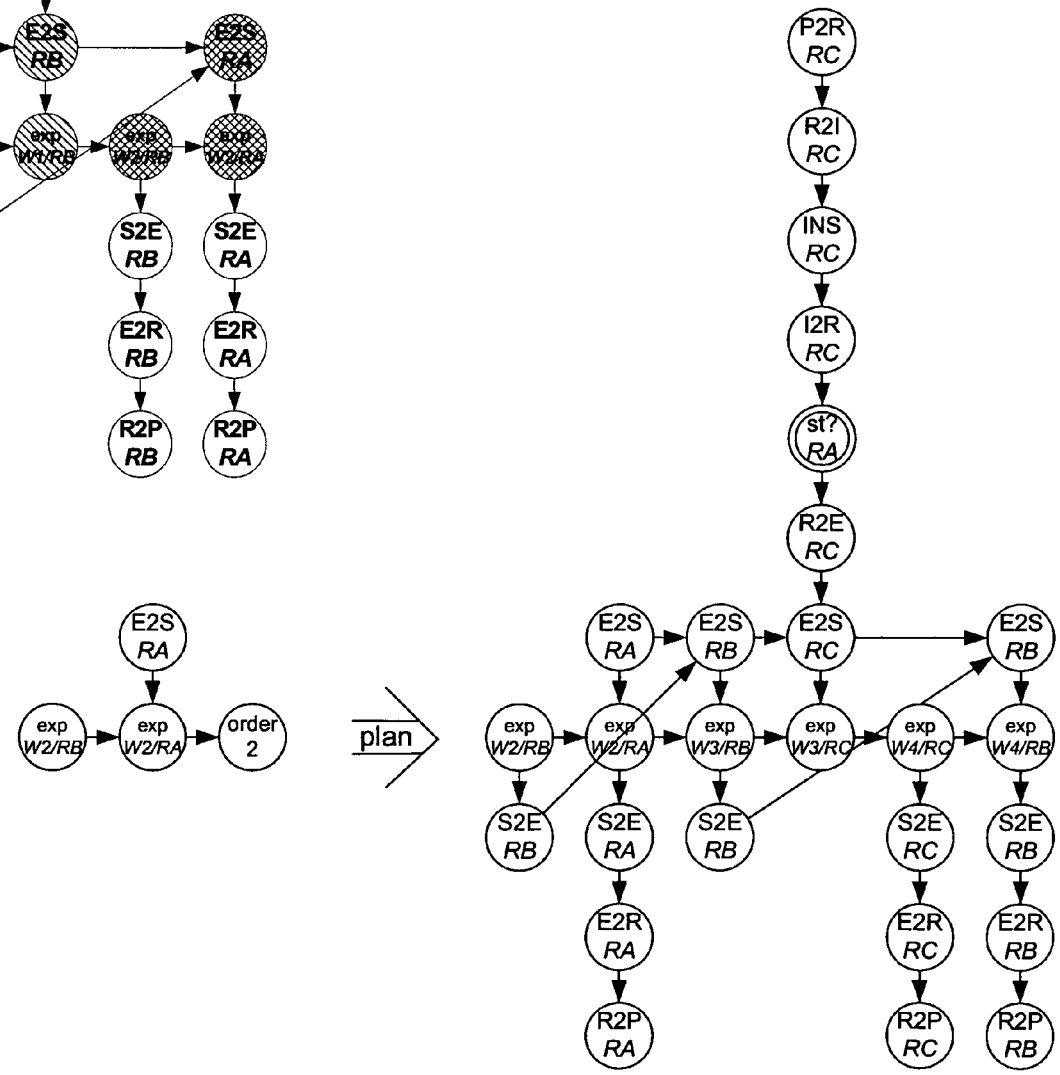
FIG. 14 shows precedence graphs before and after the planning of a new order in an example process planned by a method according to an embodiment of the invention.

Plan the result of step 2: $D_2^{eid\&init\&cp\&np}$=plan(Fstate, $D_{2c}^{eid\&init\&co\&no}$), where Fstate is the state after WF. The step is visualized in FIG. 14.

3) Schedule the result of step 2:

$$\text{schedule}(D_{2c}^{id}, \text{Dstate}', D_2^{eid\&init\&cp\&np}, D_{2c}^{init\&cp\&np}).$$

Figure 15:
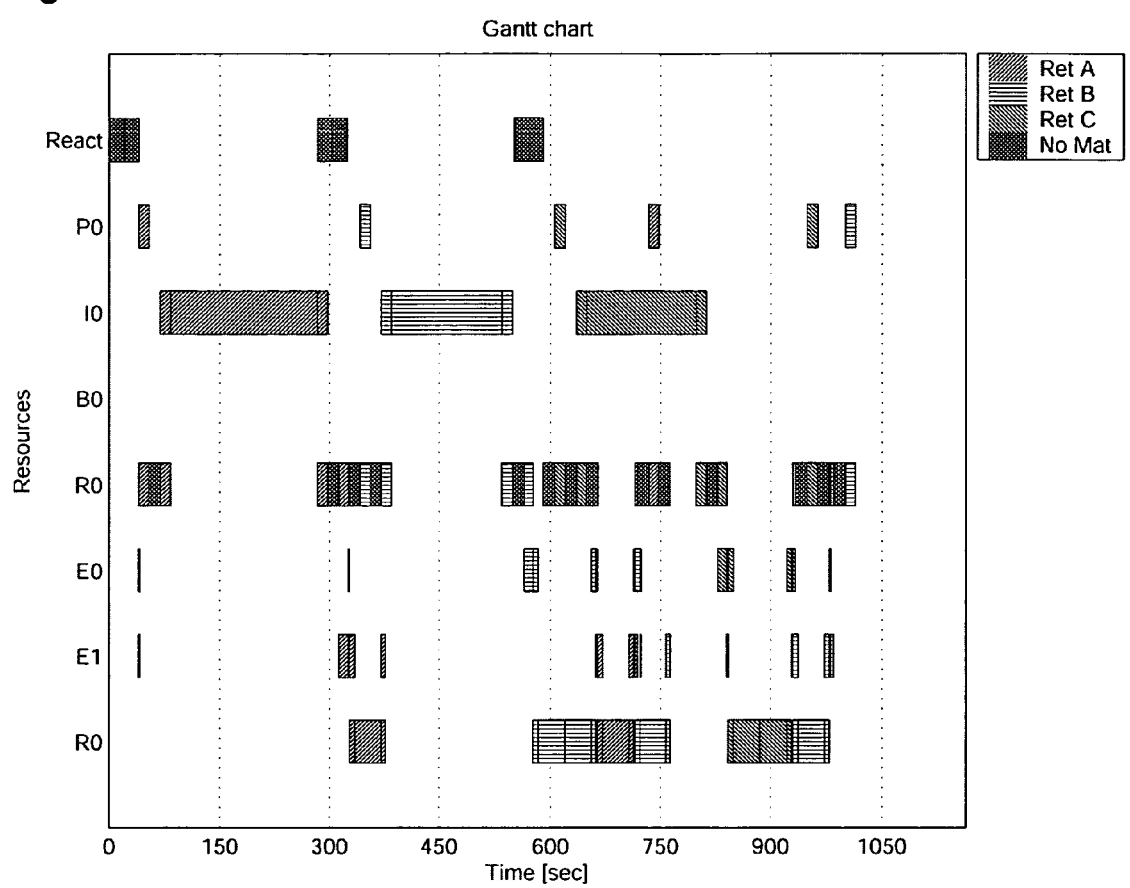
FIG. 15 is a Gantt chart of a sixth example task schedule generated by a method according to an embodiment of the invention.

In FIG. 15 the schedule resulting from this reaction scenario for the example trigger is depicted. This schedule finishes earlier than the schedule in FIG. 12, as the post unload and pre load of mask RB are skipped now during re-planning.

Besides the "nice weather" triggers addressed above, things can also go wrong: exceptions can occur, implying that tasks in the current work fail. Depending on the nature of the failure cause, recovery is or is not possible. Exceptions originating from a defective machine or material in general cannot be recovered. However, many exceptions can be recovered. Although SMC cannot affect the cause of such exceptions, it can affect the effect of them and avoid production loss by automatic recovery.

Recovery reaction scenarios can be implemented using the same functionality as reaction to "nice weather" triggers, as explained below.

Figure 16:
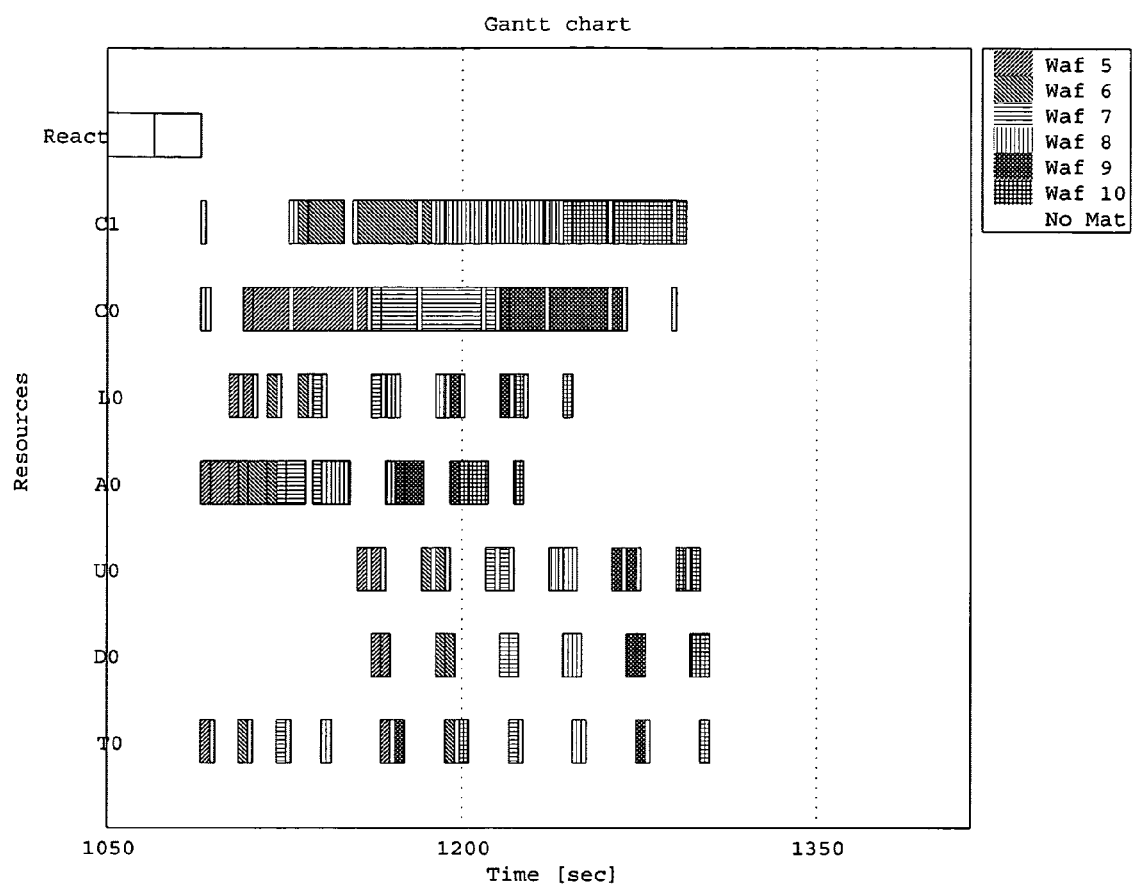
FIG. 16 is a Gantt chart of a seventh example task schedule generated by a method according to an embodiment of the invention.
Figure 17:
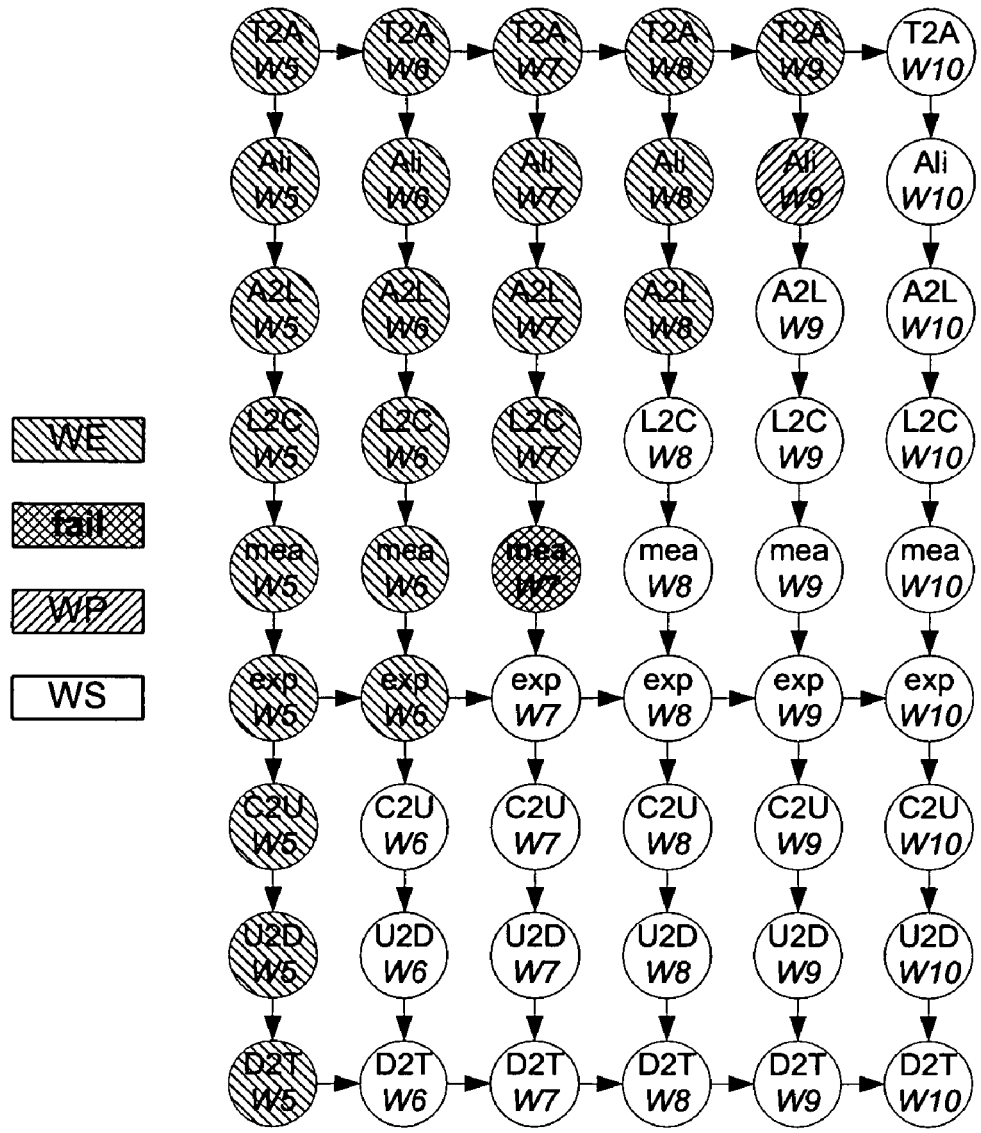
FIG. 17 is a precedence graph showing the status of the apparatus in the event of an exception in an example process planned by a method according to an embodiment of the invention.

The substrate view on another order (order 3) is used for illustration. This order is received at time=1050 sec and requests exposure of six substrates (substrates W5 through W10) with one mask (RD). The schedule for this order is depicted in FIG. 16. The measure task of substrate 7 fails. The status of the nodes at that moment is depicted in FIG. 17.

There is a fair chance that this exception can be recovered by re-aligning the substrate. The alignment unit can be reached via the unload robot, using the 'U2A' behavior that is depicted as a dashed arrow in FIG. 3. The FIFO (First In, First Out) requirement states that substrates must leave the apparatus in the same order as the order in which they entered. If the substrates that entered the apparatus after W7 follow W7 to also make a cycle, this requirement is met.

To recover from an exception by recovery, three steps are to be performed:

1) If the dispatcher receives a trigger that a task has failed, it stops dispatching. The failure message is accompanied by an exception code. The dispatcher waits until the work in process is executed and gathers other exception codes from other tasks that fail, if any.

2) Using the exception information xinfo: the set of failed tasks, their exception codes and the system state, the remaining work scheduled (WS) is re-planned to process the recovery:

$$D_2^{rec} = \text{recplan}(xinfo, D_{2c}^s)$$

Figure 18:
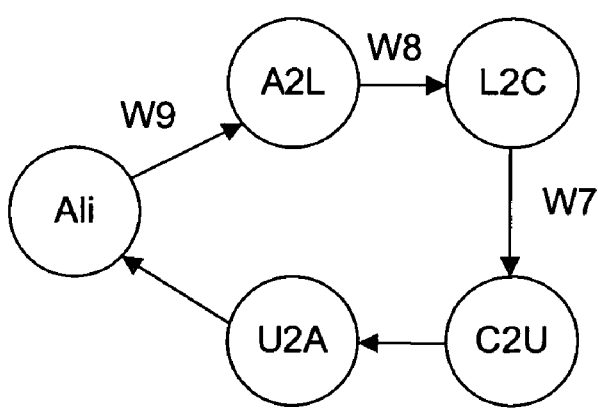
FIG. 18 is a cycle building block used to recover from an exception in an example process planned by a method according to an embodiment of the invention.
Figure 19:
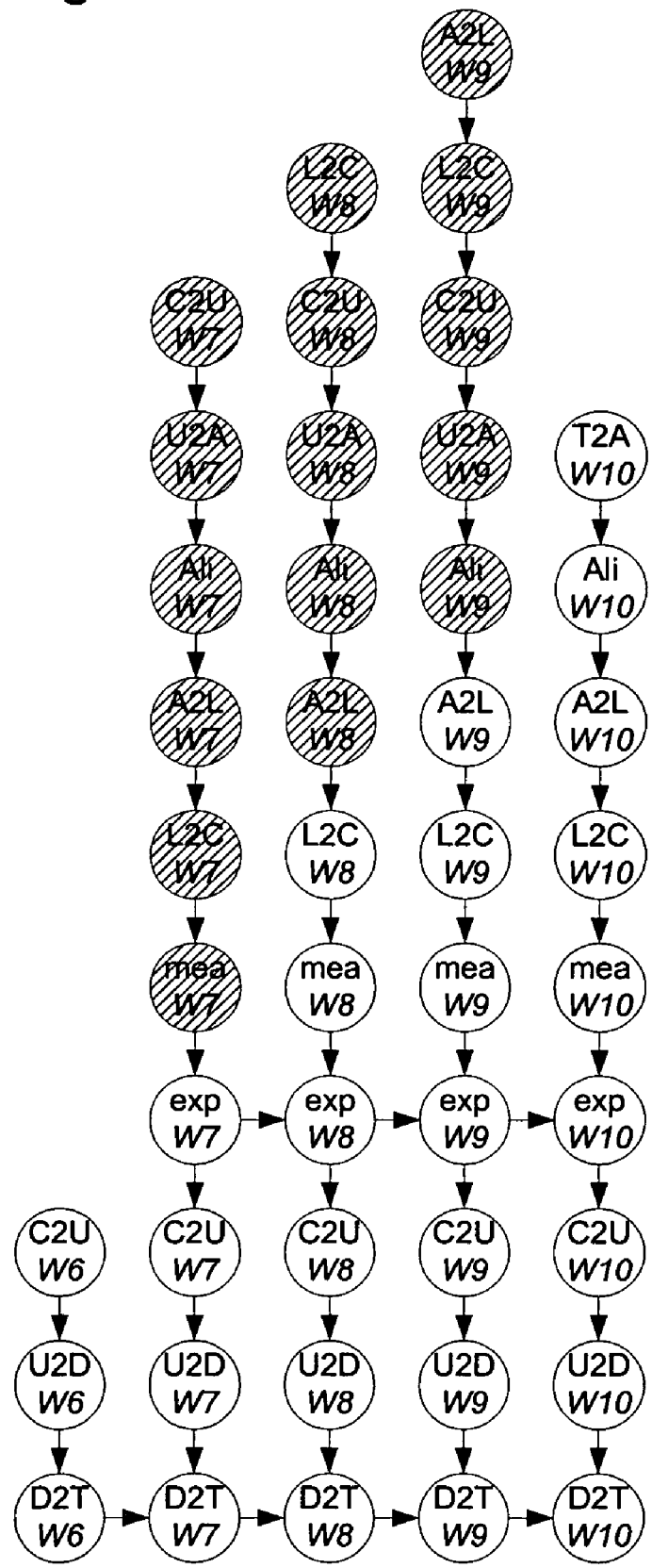
FIG. 19 is a precedence graph of a plan to recover from an exception in an example process planned by a method according to an embodiment of the invention.

The recovery plan function recplan uses a database that maps the exception information onto plan rules and building blocks. In the example case, the plan rules come down to insertion of a recovery building block defining the extra cycle before the remaining lives of substrates W7, W8, and W9. The cycle recovery building blocks can be generated from the cycle building block depicted in FIG. 18. Generation comes down to removing the precedence edge that leads to the task that transports the substrates from their current capability to the next capability involved in the cycle, as depicted in FIG. 18 for the involved substrates. The generation function that implements this, function gencrbb, is shown in the appendix. Furthermore, the measure task for W7 must be added. Although this is not the case in the example, a redundant 'Ali' node can result, which must then be removed. The revised TRS definition that results after three insertions is depicted in FIG. 19.

3) There are two possibilities to get a revised schedule including recovery.

C2a One scenario is to only schedule the recovery part, and to re-time the remainder of the old schedule. However, this scenario cannot be applied straightforwardly in the example case, as the system's material configuration after the recovery part can differ from the system's material configuration before recovery: substrates W7 through W9 can reside at the other substrate table.

Figure 20:
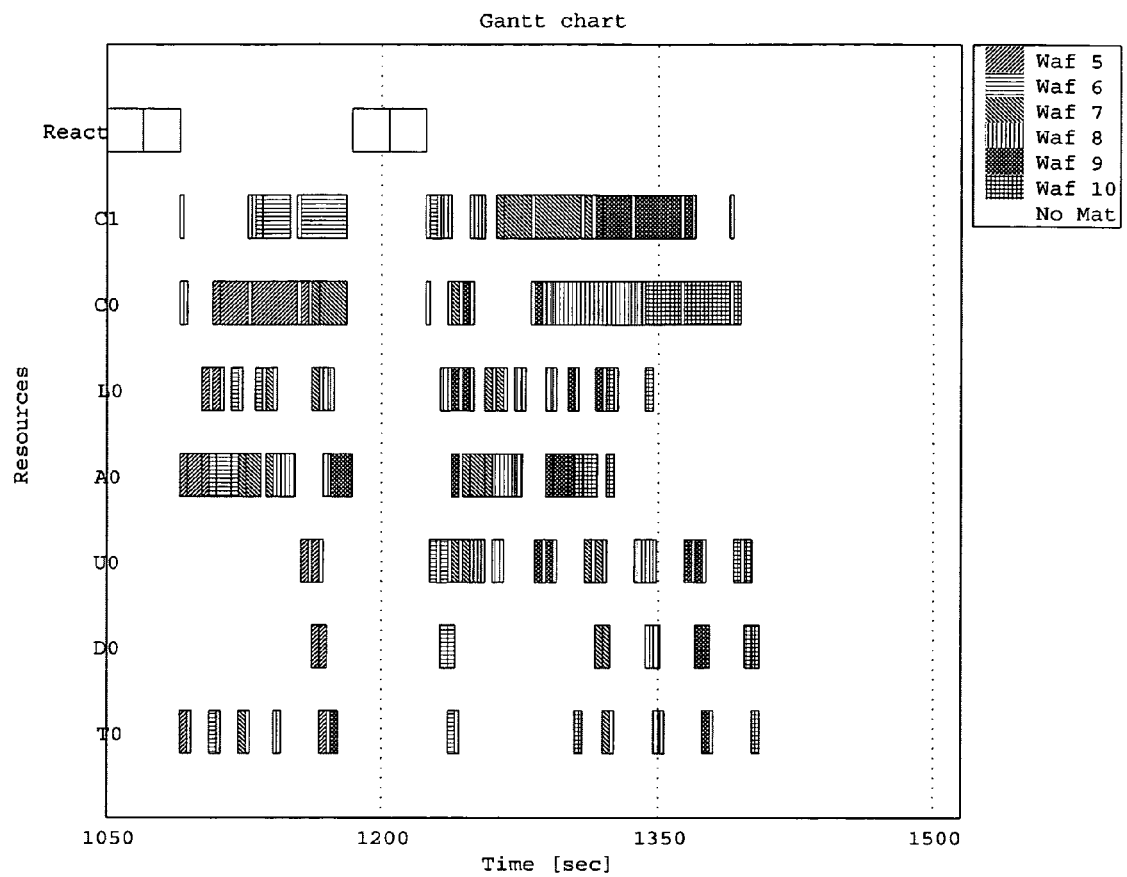
FIG. 20 is a Gantt chart of the plan of FIG. 19.

C2b A safe scenario is to schedule the entire result of step 2:

$$\text{schedule}(\emptyset, \text{Xstate}', D_2^{rec}, D_2^{rec})$$

which leads to the schedule depicted in FIG. 20.

If desired, a database of solutions to exceptions can be used to determine schedule revisions, or the jobs may remain unmodified. The final steps of scenarios C1a and C2a can be classified as 'schedule repair', whereas scenarios C1b and C2b can be classified as 'complete regeneration'.

Figure 21:
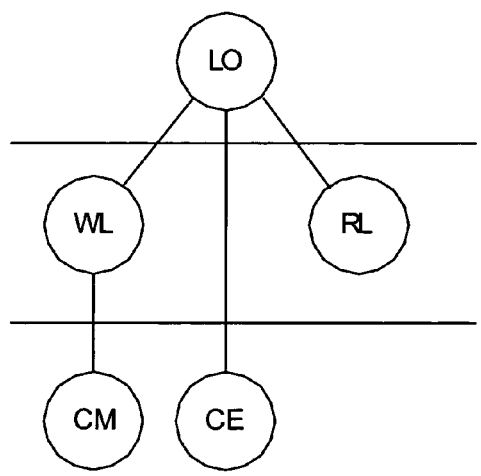
FIG. 21 depicts different levels in a multi-level control hierarchy.

The schedule and planning methodology described above employs a single layer of control. However, a multiple-layer approach can also be adopted, with planning and scheduling being carried out at different levels in a control hierarchy. In such an arrangement the lower control levels expand the plans and/or schedules of the level(s) above to a smaller grain size. FIG. 21 illustrates a control hierarchy for a lithographic apparatus such as that described in more detail above. This arrangement has the advantage that the different layers of control system maybe designed separately and brought together only at the final stage of design of the apparatus. The same advantage can be obtained with a single software controller and separate configuration files, one for each sub-controller, which are combined in the final design stage.

In the control hierarchy of FIG. 21, the highest control level is the lot control layer formed by lot control unit LO which creates a top level plan. From the top level plan, mask and substrate level tasks, expressed at a high level or large grain size, are passed to mask and substrate control units RL, WL which form the logistics control layer and expand the high level substrate and mask tasks into lower level task sequences., Finally, a route or cycle control layer, comprising controllers CM, CE controls the measure and exposure processes.

Figure 22:
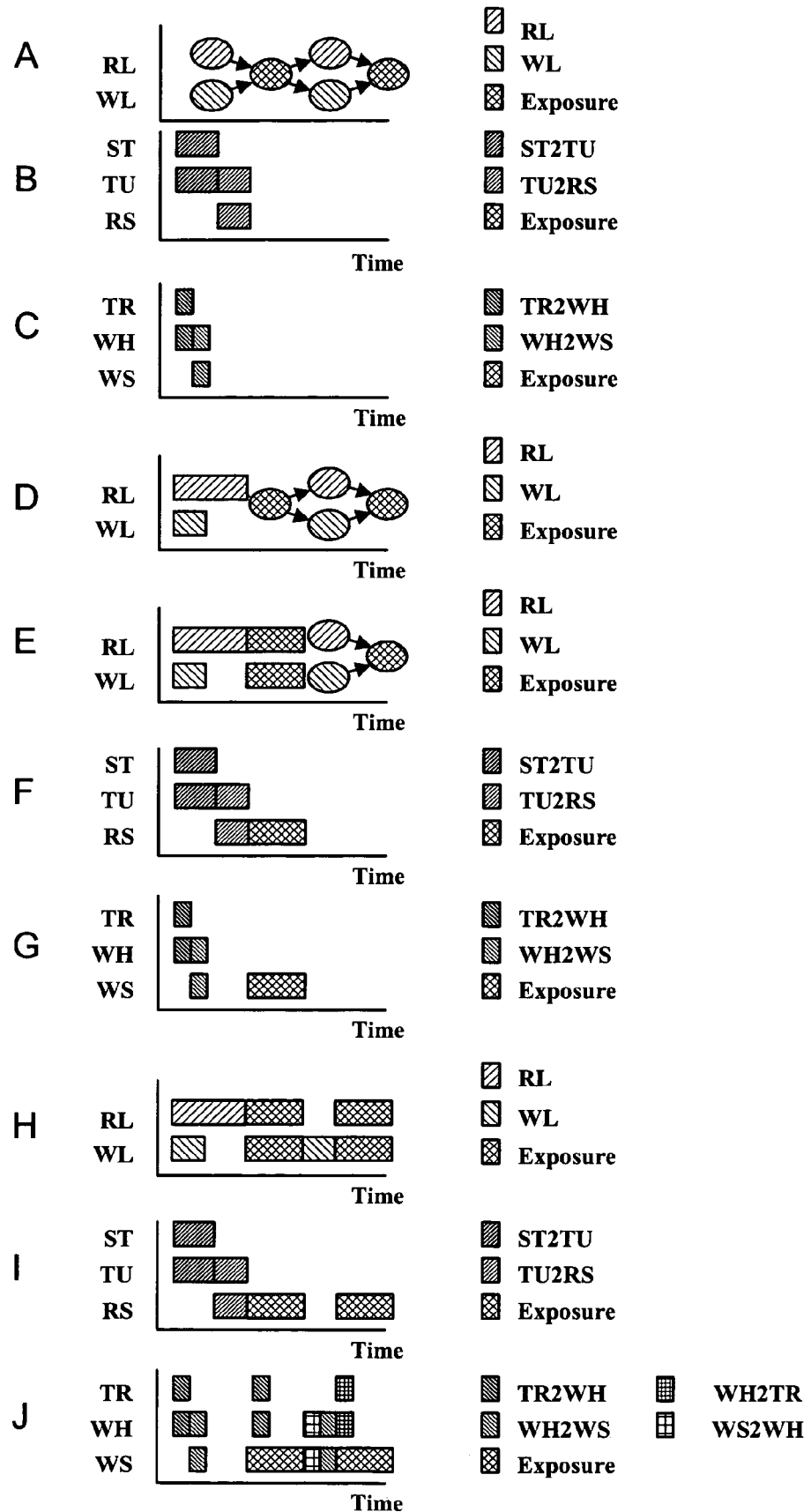
FIG. 22 depicts a negotiation process between levels in a multi-level control hierarchy.

To arrive at a complete schedule, a "negotiation" process between the control layers is performed. An example of this process is shown in FIG. 22 for the lot control and logistics control layers. In FIG. 22, A shows, in the form of a precedence graph, the initial top level plan constructed by the lot control unit LO. This comprises mask and substrate tasks to be further controlled by the mask and substrate control units RL, WL and exposure tasks involving both. The mask tasks are then planned at a finer grain size in the mask control unit RL. In this example, as shown in B, this involves scheduling mask transport tasks store to turret ST2TU and turret to mask stage TU2RS using the resources store ST, turret TU and mask stage RS. Similarly, the substrate control unit WL schedules the substrate transport tasks track to substrate handler TR2WH and substrate handler to substrate stage WH2WS.

The schedules generated by the logistics layer control units RL, WL are reported back to the lot control unit LO and enable timings to be ascribed to the initial tasks, as shown at D. This then enables the exposure task to be scheduled by the lot control unit LO, as shown in E. Since the exposure task involves both mask and substrate layer resources, its schedule is communicated back to the mask and substrate control units to be added to their schedules, as shown in F and G. The procedure continues as shown in H, I and J until a complete schedule is generated at each controller.

The fact that the mask transport tasks in the first part of the cycle take longer than the parallel substrate transport tasks means that there is a gap in the schedule of the substrate level resources. Similarly, the mask level resources are idle in the later part of the cycle. These gaps can be seen by the lot control unit LO which may use the time to schedule additional measurement, calibration or preventative maintenance tasks to improve the quality of exposures or the yield of the process. It may also be possible to begin tasks in the mask level resources relating to the next order while the substrate level resources are completing the preceding order.

APPENDICES

Generate Exposure Sequence

For the purpose of the exposure pattern case, the parameters are a tuple of tuples containing a set of capabilities and a list of material instance sets.

$Np_{2c}: N_2 \rightarrow (P(C) \times P(M)^*)^2$ is an additional element giving the parameters of the nodes.

Let function addone: $D_{2c} \times D_{2c} \times (P(C) \times P(M)^*)^2 \rightarrow D_{2c}$ be a function that adds after an existing system definition $D_{2c}^e$ a basic system definition $D_{2c}^a$, with materials inherited from np. Function addone can be defined as follows:

addone: $(D_{2c}^e, D_{2c}^a, np) = D_{2c}^{et}$ such that $(D_{2c}^{et} = D_{2c}^e \cup D_{2c}^a$ except that:

$$(\forall n^{e'} : n^{e'} \in \mathcal{N}_{2c}^a : (Cb_{2c}^{e'}(n^{e'}), Ce_{2c}^{e'}(n^{e'})) = \tag{14}$$

$$matassign(\text{true}, Cb_{2c}^a(n^{e'}), Ce_{2c}^a(n^{e'}), np) \wedge$$

$$((\nexists n^a : n^a \in \mathcal{N}_{2c}^a : n^a \in anc(n^{e'}) \vee (n^a, n^{e'}) \in P_{2c}^a) \Rightarrow$$

$$(\forall n^e : n^e \in \mathcal{N}_{2c}^e,$$

$$(\nexists n : n \in \mathcal{N}_{2c}^e : n \in anc(n^e) \vee (n^e, n) \in P_{2c}^e) :$$

$$(n^e, n^{e'}) \in P_{2c}^{e'})) \wedge Np_{2c}^{e'}(n^{e'}) =$$

$$((np.0.0, [hd(np.0.1)]), (np.1.0, [hd(np.1.1)])))$$

Using this function, genes: $D_{2c} \times \mathbb{B} \times (P(C) \times P(M)^*)^2 \times \mathbb{N} \times \mathbb{N} \times D_{2c} \rightarrow D_{2c}$ can be defined recursively. The genes function is suited to generate an exposure sequence for a wide range of exposure patterns, for processing substrates in pairs and for any number of masks: e.g. patterns A, ABBA, ABAB, ABCABC, AABB, AABBCCDDDDCCBBAA etc.

$$genes(D_{2c}^a, prs, np, RpP, WpP, \tag{15}$$

$$D_{2c}^e = \begin{cases} D_{2c}^e & \text{if } len(np.0.1) = 0 \\ genes(D_{2c}^a, prs, np', RpP', WpP', addone(D_{2c}^e, D_{2c}^a, np)) & \text{if } len(np.0.1) > 0 \end{cases}$$

Where:
$D_{2c}^{ea}$ is the basic system definition used for generation, e.g. an exposure task including all involved elements.

prs defines whether substrates are processed per pair or not, e.g. false for 'ABBA' (DET) and true for 'AABB' (DET II).

np are the node parameters, e.g. (({WS, PA, ...}, [{W1}, {W2}, {W3}, {W4}, {W5}]), ({RS, Turret, ...}, [{R1}, {R2}, {R2}, {R1}])) for a five-substrate lot with substrates W1 through W5 that must be exposed following the 'ABBA' pattern with masks R1 and R2.

RpP is the number of masks to go from that point to finish this pair of substrates (or substrate)

WpP is the number of substrates to go from that point to finish this pair of substrates for this mask $D_{2c}^e$ is the addition generated up to that point In the table below, the most important variables used in the definition above are summarized.

| prs | len(np.0.1) | RpP | WpP | np' | RpP' | WpP' |
|---|---|---|---|---|---|---|
| false | >0 | 1 | 1 | ((np.0.0, tl(np.0.1)), (np.1.0,tl(np.1.1)++[hd(np.1.1)])) | size(el(np.1.1)) | 1 |
| false | >0 | >1 | 1 | (np.0, (np.1.0,tl(np.1.1)++[hd(np.1.1)])) | RpP-1 | 1 |
| true | 1 | 1 | 1 | ((np.0.0,tl(np.0.1)),(np.1.0,tl(tl(np.1.1)))) | size(el(np.1.1)) | 1 |
| true | 1 | >1 | 1 | (np.0, (np.1.0,tl(tl(np.1.1)))) | | |

-continued

| prs | len(np.0.1) | RpP | WpP | np' | RpP' | WpP' |
|---|---|---|---|---|---|---|
| true | >1 | >1 | 2 | ((np.0.0,[hd(tl(np.0.1))]++ [hd(np.0.1)]++tl(tl(np.0.1))), (np.1.0,tl(np.1.1)++[hd(np.1.1)])) | RpP-1 RpP | 1 1 |
| true | >1 | >1 | 1 | ((np.0.0,[hd(tl(np.0.1))]++ [hd(np.0.1)]++tl(tl(np.0.1)), (np.1.0,tl(np.1.1)++[hd(np.1.1)])) | RpP-1 | 2 |
| true | >1 | 1 | 2 | ((np.0.0,tl(np.0.1)), (np.1.0,tl(np.1.1)++[hd(np.1.1([]))) | RpP | 1 |
| true | >1 | 1 | 1 | ((np.0.0,tl(np.0.1)), (np.1.0,tl(np.1.1)++[hd(np.1.1)])) | size(el(np.1.1)) | 2 |

Function gencrbb: $D_{2c} \times M \times C \rightarrow D_{2c}$ instantiates for material m residing at capability ml a cycle recovery building block $D_{2c}^{a'}$ from the cycle building block $D_{2c}^{a}$ depicted in FIG. 18. Such a generated building block can replace a general recovery node that is inserted before the remainder of the plan.

gencrbb: $(D_{2c}^{a}, m, ml) = D_{2c}^{a'}$ such that $D_{2c}^{a'} = D_{2c}^{a}$ except that:

$$(\forall n, n' : (n, n') \in P_{2c}^{a}, \qquad (16)$$

$$Cb_{2c}^{a}(n', ml) \neq \emptyset, Ce_{2c}^{a}(n', ml) = \emptyset : (n, n') \notin P_{2c}^{a}) \wedge$$

$$(\forall n, c : n \in N_{2c}^{a}, c \in I_{2c}^{a}(n) : (Cb_{2c}^{a}(n, c) \neq \emptyset \Rightarrow Cb_{2c}^{a'}(n, c) = \{m\}) \wedge$$

$$(Ce_{2c}^{a}(n, c) \neq \emptyset \Rightarrow Ce_{2c}^{a'}(n, c) = \{m\}))$$

While specific embodiments of the invention have been described above, it will be appreciated that the invention may be practiced otherwise than as described. The description is not intended to limit the invention.

The invention claimed is:

1. A method of planning and performing tasks in a machine, the machine being at least a sub-system of a lithographic apparatus or lithographic processing cell, the method comprising:
   receiving an order for work to be carried out by the machine;
   determining key tasks to be carried out to fulfill the order;
   generating a key task sequence comprising the key tasks;
   determining subsidiary tasks, including one or more logistic tasks, one or more pre-processing tasks and/or one or more post-processing tasks, to be carried out before or after each of the key tasks;
   generating a scheduling problem instance comprising the subsidiary tasks linked to respective ones of the key tasks; and perform work by the machine.

2. A method according to claim 1, wherein the one or more logistic tasks comprise tasks involved in moving materials used in the key tasks between resources of the machine.

3. A method according to claim 1, wherein an order for work comprises printing of a given pattern onto a given lot of substrates.

4. A method according to claim 3, wherein the key tasks comprise actual exposure tasks necessary to effect ordered printing.

5. A method according to claim 4, wherein the subsidiary tasks comprise one or more tasks selected from the group comprising:
   coating a substrate with a radiation-sensitive resist;
   pre-alignment of a substrate;
   measurement or characterization of a substrate;
   a transportation task;
   inspection of an exposed substrate;
   post exposure bake; and
   developing an exposed substrate.

6. A method according to claim 4, wherein the subsidiary tasks comprise one or more tasks selected from the group comprising:
   loading a mask;
   cleaning a mask;
   inspecting a mask;
   storing a mask; and
   unloading a mask.

7. A method according to claim 4, wherein the subsidiary tasks comprise one or more tasks selected from the group comprising:
   retrieval of a data file from a data storage device;
   decompressing;
   error checking;
   rasterization; and
   resetting a programmable patterning device.

8. A method according to claim 1, wherein the scheduling problem instance comprises a precedence graph.

9. A method according to claim 8, wherein generating a precedence graph comprises replacing all nodes in a first precedence graph that meet a given criteria by a sub-graph comprising linked nodes to generate a second precedence graph.

10. A method according to claim 8, wherein generating a precedence graph comprises inserting a sub-graph at all nodes in a first precedence graph that meet a given criteria to generate a second precedence graph.

11. A method according to claim 1, further comprising adding a precedence edge between at least two of the subsidiary tasks linked to different ones of the key tasks.

12. A method according to claim 11, wherein adding a precedence edge comprises adding a precedence edge between all tasks involving a same material.

13. A method according to claim 11, wherein adding a precedence edge comprises adding a precedence edge between all tasks of a same type.

14. A device manufacturing method comprising planning tasks to be performed by a lithographic projection apparatus according to the method of claim 1, and performing the planned tasks, a task including projecting a patterned beam of radiation onto a target portion of a substrate.

15. A supervisory control system configured to control a machine, the machine being at least a sub-system of a lithographic apparatus or a lithographic processing cell, the control system comprising:

an input device configured to receive an order for work to be carried out by the machine;

a key task determining mechanism configured to determine key tasks to be carried out to fulfill the order;

a task sequence generator configured to generate a key task sequence comprising the key tasks;

a subsidiary task determining mechanism configured to determine subsidiary tasks, including one or more logistic tasks, one or more pre-processing tasks and/or one or more post-processing tasks, to be carried out before or after each of the key tasks; and a scheduling problem instance generator configured to generate a scheduling problem instance comprising the subsidiary tasks linked to respective ones of the key tasks; and at least one resource configured to execute the generated scheduling problem instance.

16. A supervisory control system according to claim 15, wherein the scheduling problem instance comprises a precedence graph.

17. A supervisory control system according to claim 15, wherein the scheduling problem instance generator comprises a replacing unit configured to replace all nodes in a first precedence graph that meet a given criteria by a sub-graph comprising linked nodes to generate a second precedence graph.

18. A supervisory control system according to claim 15, wherein the scheduling problem instance generator comprises an inserting unit configured to insert a sub-graph at all nodes in a first precedence graph that meet a given criteria to generate a second precedence graph.

19. A supervisory control system according to claim 15, further comprising a precedence edge adder configured to add a precedence edge to between at least two of the subsidiary tasks linked to different ones of the key tasks.

20. A supervisory control system according to claim 19, wherein the precedence edge adder is configured to add a precedence edge between all tasks involving a same material.

21. A supervisory control system according to claim 19, wherein the precedence edge adder is configured to add a precedence edge between all tasks of a same type.

22. A lithographic apparatus comprising:

an illuminator configured to condition a beam of radiation;

a support structure configured to hold a patterning device, the patterning device serving to impart the beam with a pattern in it cross section;

a substrate table configured to hold a substrate;

a projection system configured to project the patterned beam onto a target portion of the substrate; and a supervisory control system according to claim 15.

23. A track unit comprising a substrate handling device, a pre- and post-processing device and a supervisory control system according to claim 15.

24. A lithographic processing cell comprising a lithographic apparatus, a track unit and a control system according to claim 15.

25. A computer readable medium containing computer-executable instructions configured to control a machine, the machine being at least a part of a lithographic apparatus or a lithographic processing cell, wherein the computer-executable instructions are configured to instruct a computer system to perform a method, the method comprising:

receiving an order for work to be carried out by the machine;

determining key tasks to be carried out to fulfill the order;

generating a key task sequence comprising the key tasks;

determining subsidiary tasks, including one or more logistics tasks, one or more pre-processing tasks and/or one or more post-processing tasks, to be carried out before or after each of the key tasks;

generating a scheduling problem instance comprising the subsidiary tasks linked to respective ones of the key tasks; and executing the generated scheduling problem instance.

26. A computer readable medium according to claim 25, wherein the one or more logistic tasks comprise tasks involved in moving materials used in the key tasks between resources of the machine.

27. A computer readable medium according to claim 25, wherein an order for work comprises printing of a given pattern onto a given lot of substrates.

28. A computer readable medium according to claim 27, wherein the key tasks comprise actual exposure tasks necessary to effect ordered printing.

29. A computer readable medium according to claim 25, wherein the scheduling problem instance is in the form of a precedence graph.

30. A computer readable medium according to claim 29, wherein generating a precedence graph comprises replacing all nodes in a first precedence graph that meet a given criteria by a sub-graph comprising linked nodes to generate a second precedence graph.

31. A computer readable medium according to claim 29, wherein generating a precedence graph comprises inserting a sub-graph at all nodes in a first precedence graph that meet a given criteria to generate a second precedence graph.

32. A computer readable medium according to claim 25, further comprising adding a precedence edge between at least two of the subsidiary tasks linked to different ones of the key tasks.

33. A computer readable medium according to claim 32, wherein adding a precedence edge comprises adding a precedence edge between all tasks involving a same material.

34. A computer readable medium according to claim 32, wherein adding a precedence edge comprises adding a precedence edge between all tasks of a same type.

* * * * *